(12) United States Patent
Zou et al.

(10) Patent No.: US 11,522,514 B2
(45) Date of Patent: *Dec. 6, 2022

(54) PISTON MODE LAMB WAVE RESONATORS

(71) Applicant: Skyworks Solutions, Inc., Irvine, CA (US)

(72) Inventors: Jie Zou, Irvine, CA (US); Jiansong Liu, Irvine, CA (US); Gong Bin Tang, Moriguchi (JP); Chih-Ming Lin, Fremont, CA (US); Chun Sing Lam, San Jose, CA (US)

(73) Assignee: Skyworks Solutions, Inc., Irvine, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/117,816

(22) Filed: Dec. 10, 2020

(65) Prior Publication Data

US 2021/0099153 A1    Apr. 1, 2021

Related U.S. Application Data

(63) Continuation of application No. 16/119,775, filed on Aug. 31, 2018, now Pat. No. 10,873,313.

(Continued)

(51) Int. Cl.
*H03H 9/02* (2006.01)
*H03H 9/17* (2006.01)
(Continued)

(52) U.S. Cl.
CPC .... *H03H 9/02228* (2013.01); *H03H 9/02031* (2013.01); *H03H 9/02062* (2013.01);
(Continued)

(58) Field of Classification Search
CPC .. H03H 9/02; H03H 9/02228; H03H 9/02031; H03H 9/02062; H03H 9/902086;
(Continued)

(56) References Cited

U.S. PATENT DOCUMENTS 7,327,070 B2    2/2008    Tanaka
7,576,471 B1    8/2009    Solal
(Continued)

FOREIGN PATENT DOCUMENTS

DE    102 41 425    3/2004

OTHER PUBLICATIONS

Gao, A. et al., A 3.5GHz AlN S1 Lamb mode resonator, in *Proc. IEEE Intl. Ultrasonics Symp.*, Washington, D.C., Sep. 2017, pp. 1-4.
(Continued)

*Primary Examiner* — Samuel S Outten
*Assistant Examiner* — Jorge L Salazar, Jr.
(74) *Attorney, Agent, or Firm* — Knobbe, Martens, Olson & Bear, LLP

(57) ABSTRACT

Piston mode Lamb wave resonators are disclosed. A piston mode Lamb wave resonator can include a piezoelectric layer, such as an aluminum nitride layer, and an interdigital transducer on the piezoelectric layer. The piston mode Lamb wave resonator has an active region and a border region, in which the border region has a velocity with a lower magnitude than a velocity of the active region. The border region can suppress a transverse mode.

20 Claims, 17 Drawing Sheets

Related U.S. Application Data

(60) Provisional application No. 62/553,747, filed on Sep. 1, 2017.

(51) Int. Cl.
  *H03H 9/13* (2006.01)
  *H03H 9/56* (2006.01)

(52) U.S. Cl.
  CPC ........ *H03H 9/02086* (2013.01); *H03H 9/132* (2013.01); *H03H 9/173* (2013.01); *H03H 9/175* (2013.01); *H03H 9/176* (2013.01); *H03H 9/562* (2013.01)

(58) Field of Classification Search
  CPC ........ H03H 9/132; H03H 9/173; H03H 9/175; H03H 9/176; H03H 9/562
  USPC .................... 333/133, 186, 187, 193–196
  See application file for complete search history.

(56) References Cited

U.S. PATENT DOCUMENTS

| | | | |
|---|---|---|---|
| 8,283,835 | B2 | 10/2012 | Metzger et al. |
| 10,873,313 | B2* | 12/2020 | Zou ........................ H03H 9/132 |
| 2009/0102316 | A1 | 4/2009 | Belot et al. |
| 2010/0237959 | A1 | 9/2010 | Tanaka |
| 2011/0068655 | A1 | 3/2011 | Solal et al. |
| 2012/0161577 | A1 | 6/2012 | Abbott et al. |
| 2016/0087187 | A1* | 3/2016 | Burak .................. H01L 41/047 310/349 |
| 2016/0126928 | A1* | 5/2016 | Ruile ................ H03H 9/02535 310/313 B |
| 2016/0336919 | A1* | 11/2016 | Taniguchi .......... H03H 9/02559 |
| 2017/0093367 | A1 | 3/2017 | Mimura |
| 2017/0222619 | A1 | 8/2017 | Iwamoto et al. |
| 2017/0244378 | A1 | 8/2017 | Kim et al. |
| 2019/0068159 | A1* | 2/2019 | McHugh ............ H03H 9/02834 |

OTHER PUBLICATIONS

Gao, A. et al., Harnessing mode conversion for spurious mode suppression in AlN laterally vibrating resonators, *J. Microelectromech. Syst.*, vol. 25, pp. 450-458, Jun. 2016.

Giovannini, M. et al., Apodization technique for spurious mode suppression in AlN contour-mode resonators, *Sensors and Actuators A*, vol. 206, pp. 42-50, Dec. 2013.

Hashimoto, K. *Surface Acoustic Wave Devices in Telecommunications: Modelling and Simulation* (Springer-Verlag, Germany, 2000).

Hashimoto, K. et al., Wideband love wave filters operating in GHz range on Cu-grating/rotated-YX LiNbO3-substrate structure, in *Proc. IEEE Intl. Ultrasonics Symp.*, Montréal, Canada, Aug. 2004, pp. 1330-1334.

Kaitila, J. et al., Spurious resonance free Bulk acoustic wave resonators, in *Proc. IEEE Intl. Ultrasonics Symp.*, Honolulu, HI, Oct. 2003, pp. 84-87.

Lin, C.M. et al., Two-Port Filters and Resonators on AlN-3c SiC Plates utilizing high-order Lamb wave modes, IEEE 26th International Conference on Micro Electro Mechanical Systems (MEMS), Taipei, 2013, pp. 789-792.

Lin, C.M. et al., Micromachined one-port aluminum nitride Lamb wave resonators utilizing the lowest-order symmetric mode, *J. Microelectromech. Syst.*, vol. 23, pp. 78-91, Feb. 2014.

Lin, Chih-Ming, "Temperature Compensation of Aluminum Nitride Lamb Wave Resonators Utilizing the Lowest-Order Symmetric Mode," Electrical Engineering and Computer Sciences University of California at Berkley, Technical Report No. UCB/EECS-2012-264, Dec. 14, 2012.

Piazza, G. et al., Piezoelectric Aluminum nitride vibrating contour-mode MEMS resonators, *J. Microelectromech. Syst.*, vol. 15, pp. 1406-1418, Dec. 2006.

Solal, M. et al., Transverse modes suppression and loss reduction for buried electrodes SAW devices, in *Proc. IEEE Intl. Ultrasonics Symp.*, San Diego, CA, Oct. 2010, pp. 624-628.

Thalhammer, R. et al., Spurious mode suppression in BAW resonators, in *Proc. IEEE Intl. Ultrasonics Symp.*, Vancouver, Canada, Oct. 2006, pp. 456-459.

Yantchev, V. et al., Thin AlN Film Resonators utilizing the Lowest order Symmetric Lamb mode: Further Developments, Proceedings of the IEEE International Frequency Control Symposium and Exposition, 2007, pp. 1067-1072.

Yantchev, V. et al., Thin film Lamb wave resonators in frequency control and sensing applications: a review, *J. Micromech.Microeng.*, vol. 23, 043001, Apr. 2013.

Yantchev, V. et al., Thin-film zero-group-velocity Lamb wave resonator, *Appl. Phys. Lett.*, vol. 99, 033505, 2011.

Zhang, H. et al., Spurious-free Lamb wave resonators with protrusion structures, *Appl. Phys. Lett.*, vol. 107, 243502, Dec. 2015.

Zhang, H. et al., Transverse mode spurious resonance suppression in Lamb wave MEMS resonators: theory, modeling, and experiment, IEEE Trans. Electron Devices, vol. 62, pp. 3034-3041, Sep. 2015.

Zou, J. et al., Quality factor enhancement in Lamb wave resonators utilizing butterfly-shaped AlN plates, in *Proc. IEEE Intl. Ultrasonics Symp.*, Chicago, IL, Sep. 2014, pp. 81-84.

Zou, J. et al., Temperature compensation of the AlN Lamb wave resonators utilizing the S1 mode, in *Proc. IEEE Intl. Ultrasonics Symp.*, Taipei, Taiwan, Nov. 2015, pp. 1-4.

Zou, J. et al., Theoretical study of thermally stable SiO2/AlN/SiO2 Lamb wave resonators at high temperatures, *J. Appl. Phys.*, vol. 115, 094510, Mar. 2014.

Zou, J. et al., Transducer design for AlN Lamb wave resonators, *J. Appl. Phys.*, vol. 115, 094510, Mar. 2014.

Zou, J. et al., High-frequency and low-resonance-impedance Lamb wave resonators utilizing the S1 mode, in *Tech. Dig. Intl. Conf. Solid-State Sens. Actuators Microsyst.(Transducers)*, Anchorage, AK, Jun. 2015, pp. 2025-2028.

Zou, et al., Transducer design for AlN Lamb wave resonators. *J. Appl. Phys.* 121, 154502, 2017.

Zou, J., High Quality Factor Lamb Wave Resonators, Research Project submitted to the Department of Electrical Engineering and Computer Sciences University of California at Berkeley, Jan. 6, 2015.

* cited by examiner

PISTON MODE LAMB WAVE RESONATORS

CROSS-REFERENCE TO RELATED APPLICATION

Any and all applications for which a foreign or domestic priority claim is identified in the Application Data Sheet, or any correction thereto, are hereby incorporated by reference under 37 CFR 1.57.

BACKGROUND

Technical Field

Embodiments of this disclosure relate to Lamb wave resonators.

Description of Related Technology

Piezoelectric microelectromechanical systems (MEMS) resonators can be used in radio frequency systems. Piezoelectric MEMS resonators can process electrical signals using mechanically vibrating structures. Some piezoelectric MEMS resonators are aluminum nitride (AlN) Lamb wave resonators.

Acoustic wave filters can include Lamb wave resonators. Acoustic wave filters can filter radio frequency signals in radio frequency electronic systems. For instance, filters in a radio frequency front end of a mobile phone can include acoustic wave filters. Multiple acoustic wave filters can be arranged as a multiplexer, such as a duplexer.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a piston mode Lamb wave resonator with transverse mode suppression. The piston mode Lamb wave resonator includes a piezoelectric layer and an interdigital transducer, in which the interdigital transducer is on the piezoelectric layer. The piston mode Lamb wave resonator has an active region and a border region. The border region has a first velocity with a lower magnitude than a second velocity of the active region. The border region is configured to suppress a transverse mode. The piston mode Lamb wave resonator is configured to generate a Lamb wave.

The interdigital transducer can include a bus bar and a plurality of fingers extending from the bus bar, in which each of the fingers has an end portion opposite the bus bar. The end portions of the fingers can include metal that is wider than other portions of the respective fingers. The interdigital transducer can include a second bus bar having a lower metal coverage ratio adjacent the end portions than in other portions of the second bus bar. An oxide can be included over the end portions of the fingers. Alternatively or additionally, silicon nitride can be included over a portion of the interdigital transducer, and the end portions being free from the silicon nitride.

The border region can have a larger metal coverage ratio than the active region. Alternatively or additionally, the border region can have a larger metal coverage ratio than an inactive region of the piston mode Lamb wave resonator.

The piston mode Lamb wave resonator can include reflective gratings on opposing sides of the interdigital transducer. Alternatively, the piston mode Lamb wave resonator can have free edges.

The piezoelectric layer can be an aluminum nitride layer. The aluminum nitride layer can be on a silicon layer. The piston mode Lamb wave resonator can include an air cavity on an opposite side of the piezoelectric layer than the interdigital transducer. Alternatively, the piston mode Lamb wave resonator can include an acoustic mirror on an opposite side of the piezoelectric layer than the interdigital transducer.

Another aspect of this disclosure is an acoustic wave filter with a piston mode Lamb wave resonator. The acoustic wave filter includes an input node configured to receive a radio frequency signal, an output node, and a piston mode Lamb wave resonator coupled between the input node and the output node. The piston mode Lamb wave resonator has an active region and a border region. The border region has a first velocity with a lower magnitude than a second velocity of the active region. The border region is configured to suppress a transverse mode. The acoustic wave filter is configured to filter the radio frequency signal.

The border region can have a larger metal coverage ratio than the active region. The Lamb wave resonator can include an interdigital transducer that includes a bus bar and fingers extending from the bus bar, in which a finger of the fingers includes an end portion opposite the bus bar that has metal that is wider than other portions of the finger. The Lamb wave resonator can include an interdigital transducer and a layer over the interdigital transducer that contributes to the first velocity having the lower magnitude than the second velocity. The Lamb wave resonator can include an aluminum nitride layer.

Another aspect of this disclosure is a method of filtering a radio frequency signal using a piston mode Lamb wave resonator. The method includes providing the radio frequency signal to a filter that includes the piston mode Lamb wave resonator, in which the Lamb wave resonator including an aluminum nitride piezoelectric substrate. The method further includes filtering the radio frequency signal with the filter. The filter includes suppressing a transverse mode using a border region of the piston mode Lamb wave resonator, in which the border region has a first velocity with a lower magnitude than a second velocity of an active region of the piston mode Lamb wave resonator.

A metal layout of an interdigital transducer of the piston mode Lamb wave resonator can contribute to the first velocity having the lower magnitude than the second velocity. Alternatively or additionally, a layer over at least a portion of the interdigital transducer can contribute to the first velocity having the lower magnitude than the second velocity.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Embodiments of this disclosure will now be described, by way of non-limiting example, with reference to the accompanying drawings.

FIG. 5A illustrates an interdigital transducer (IDT) of traditional Lamb wave resonator and a corresponding velocity profile and displacement profiles. FIG. 5B illustrates an IDT of a piston mode Lamb wave resonator according to an embodiment and a corresponding velocity profile and displacement profiles.

FIG. 10A illustrates an IDT with fingers having hammer head shaped end portions. FIG. 10B illustrates an IDT with thicker portions for both border regions of each finger. FIG. 10C illustrates an IDT with fingers having hammer head shaped end portions and bus bars having extension portions adjacent to the end portions of the fingers. FIG. 10D illustrates an IDT with thicker end portions on border regions of each finger and bus bars having extension portions adjacent to end portions of the fingers. FIG. 10E illustrates an IDT with fingers having thicker end portions and thicker regions extending from a bas bar toward an active region. FIG. 10F illustrates an IDT with bus bars having holes. FIG. 10G illustrates another IDT with bus bars having holes. FIG. 10H illustrates an IDT with fingers having thicker metal on both border regions. FIG. 10I illustrates an IDT with fingers having an oxide over border regions. FIG. 10J illustrates an IDT with fingers having silicon nitride over an active region and border regions free from silicon nitride.

FIG. 11A illustrates a Lamb wave resonator with a grounded electrode. FIG. 11B illustrates a Lamb wave resonator with a floating electrode. FIG. 11C illustrates a Lamb wave resonator without an electrode on a side of a piezoelectric layer that opposes an interdigital transducer (IDT) electrode. FIG. 11D illustrates another Lamb wave resonator. FIG. 11E illustrates another Lamb wave resonator. FIG. 11F illustrates another Lamb wave resonator.

FIG. 12A illustrates a Lamb wave resonator with a grounded electrode. FIG. 12B illustrates a Lamb wave resonator with a floating electrode. FIG. 12C illustrates a Lamb wave resonator without an electrode on a side of a piezoelectric layer that opposes an IDT electrode. FIG. 12D illustrates another Lamb wave resonator. FIG. 12E illustrates another Lamb wave resonator. FIG. 12F illustrates another Lamb wave resonator.

DETAILED DESCRIPTION OF CERTAIN EMBODIMENTS

Figure 1:
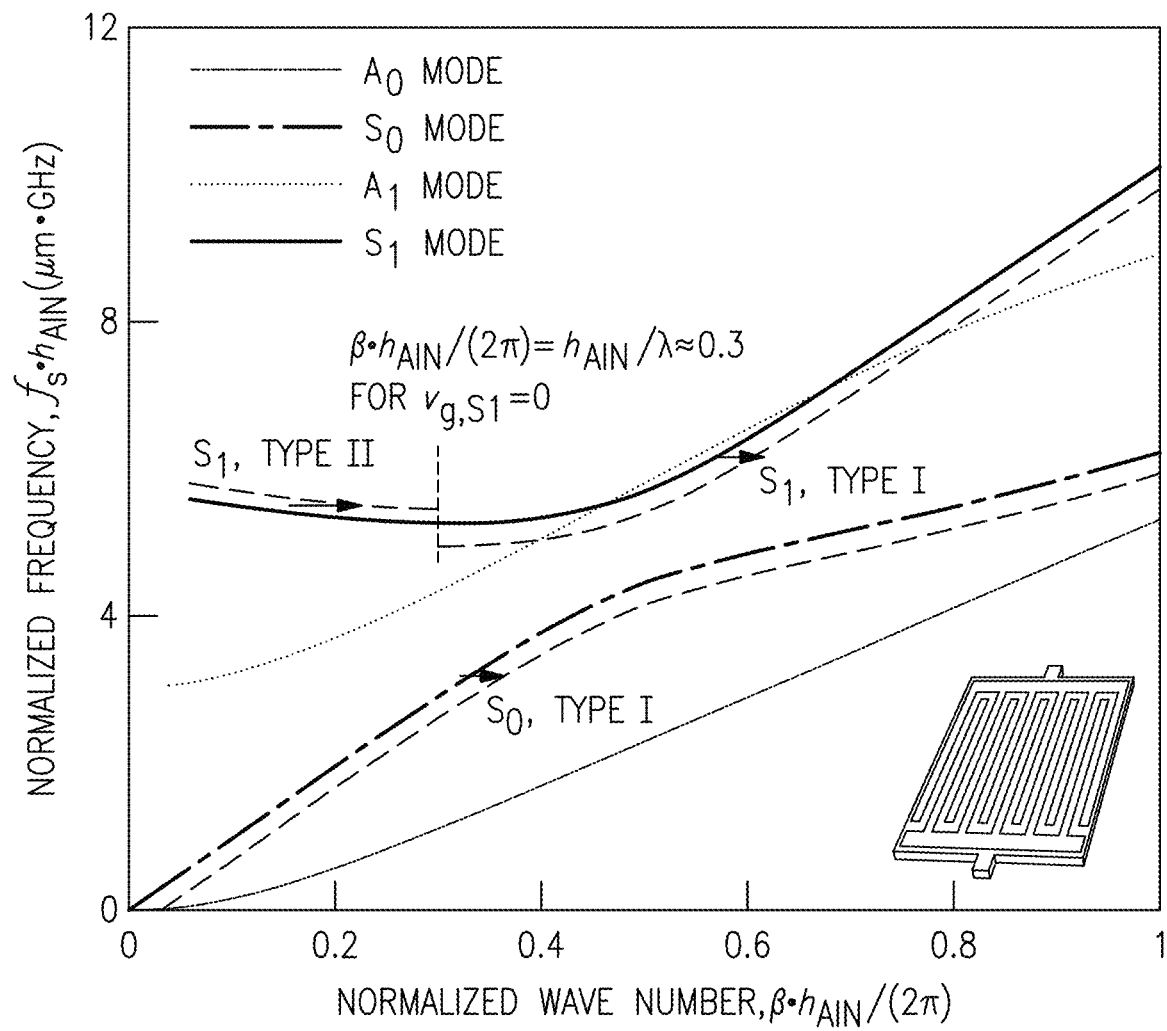
FIG. 1 is a graph that includes dispersion curves for the first four Lamb wave modes of a Lamb Wave resonator and the desired border region Eigen-frequencies for $S_0$ and $S_1$ modes.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings.

Piezoelectric microelectromechanical systems (MEMS) resonators offer fascinating prospects for frequency selection, control, and sensing applications thanks to their relatively small size and relatively low resonance impedance. Among various piezoelectric MEMS resonators, aluminum nitride (AlN) Lamb wave resonators are capturing attention since they enjoy advantages of both surface acoustic wave (SAW) devices and film bulk acoustic resonators (FBARs). Such Lamb wave resonators can have multi-frequency and complementary metal oxide semiconductor (CMOS) compatibility. For all Lamb wave modes propagating in an aluminum nitride plate, the lowest order symmetric ($S_0$) and first order symmetric ($S_1$) modes stand out for their transduction efficiency.

A Lamb wave resonator can combine features of a SAW resonator and a BAW resonator. A Lamb wave resonator typically includes an interdigital transducer (IDT) electrode similar to a SAW resonator. Accordingly, the frequency of the Lamb wave resonator can be lithographically defined. A Lamb wave resonator can achieve a relatively high quality factor (Q) and a relatively high phase velocity like a BAW filter (e.g., due to a suspended structure). A Lamb wave resonator that includes an aluminum nitride piezoelectric layer can be relatively easy to integrate with other circuits, for example, because aluminum nitride process technology can be compatible with complementary metal oxide semiconductor (CMOS) process technology. Aluminum nitride Lamb wave resonators can overcome a relatively low resonance frequency limitation and integration challenge associated with SAW resonators and also overcome multiple frequency capability challenges associated with BAW resonators. Aluminum nitride Lamb wave resonators can also be desirable due to their relatively small size.

In general, high quality factor (Q), large effective electromechanical coupling coefficient ($k^2_{eff}$), high frequency ability, and spurious free are 4 significant aspects for micro resonators to enable low-loss filters, stable oscillators, and sensitive sensors. While the lowest order symmetric ($S_0$) and first order symmetric ($S_1$) Lamb wave resonators excellently address the high (Q), large ($k^2_{eff}$), and high frequency ability, they exhibit can strong affinity toward multimode behavior along with their transduction efficiency. Lamb wave resonators can have relatively strong transverse mode in and/or near a pass band. The presence of the relatively strong transverse modes can hinder the accuracy and/or stability of oscillators and sensors, as well as hurt the performance of acoustic filters by creating relatively severe passband ripples and potentially limiting the rejection.

Apodization is a solution for transverse modes in the interdigital traducer electrode (IDT)-excited devices by varying the resonance cavity length to smooth out the effect of transverse mode on the electrical response. Its incomplete transduction from the electrical field to main mode resonance can result in substantial drawbacks, such as reduction of the transduction efficiency (e.g., degraded $k^2$) and additional losses (e.g., degraded Q) for both SAW filters and Lamb wave resonators.

A technical solution for suppressing transverse modes is to create a border region with a different frequency from active region according to the mode dispersion characteristic. This can be referred to as a "piston mode." A piston mode can be obtained to cancel out the transverse wave vector in a lateral direction without significantly degrading the $k^2$ or Q. By including a relatively small border region with a slow velocity on the edge of the acoustic aperture of a Lamb wave resonator, a propagating mode can have a zero (or approximately zero) transverse wave vector in the active aperture. The transverse wave vector can be real in the border region and imaginary on a gap region. A piston mode Lamb wave resonator can have even order modes that have a multiple of full wave lengths in the active region, which should not significantly couple to electrical domain. A piston mode Lamb wave resonator have maintain transduction without introducing acoustic loss compared to apodization.

Most Lamb wave modes in aluminum nitride show a positive slope in the dispersion branch, so that a border region of lower eigenresonance frequency may be desired for spurious mode suppression. Dispersion calculations and finite element method (FEM) simulations indicate that, by changing transducer layout, the guiding can be improved and a piston mode can be obtained for the type I Lamb wave modes.

FIG. 1 is a graph that includes dispersion curves for the first four Lamb wave modes of a Lamb Wave resonator and the desired border region Eigen-frequencies for $S_0$ and $S_1$ modes. The $S_0$ mode exhibits positive slope through all wave numbers in the illustrated range. This indicates a positive group velocity ($v_g$) and type I dispersion. The $S_1$ mode has a negative group velocity at $h_{A1N}/\lambda<0.3$ corresponding to type II dispersion and positive slope at $h_{A1N}/\lambda>0.3$ corresponding to type I dispersion.

To operate in piston mode, for resonances of type I dispersion, the frequency of the border region should be lower than that of the active area. This is similar to the typical case for ZnO FBAR and SAW filters (non-dispersive Rayleigh wave or SH wave has positive dispersion slope of $2\pi \cdot v_p$). On the contrary, for resonances of type II dispersion, the frequency of the border region should be higher than that of the active area to operate in piston mode. This is typically the case for AlN FBAR.

However, for the LWR employing $S_1$ mode in the type II region, the transverse modes are not typically strongly excited, mostly below fs. Some other spurious modes, such as the inter-reflection from IDT fingers due to negative velocity, are typically much stronger and more of concern. Accordingly, the transverse modes and the design of piston mode for S0 mode and type I S1 mode are emphasized herein.

Similar to FBAR and SAW resonators, the odd transverse modes are naturally cancelled in the electrical response of an LWR. This is shown in the left column of FIG. 5.

The IDT aperture and transverse mode order can directly determine the wave number in a lateral direction βy as indicated by Equation 1.

$$\beta_y = \frac{\pi \cdot (n+1)}{w_a} \quad \text{(Equation 1)}$$

In Equation 1, $w_a$ represents the active region width or aperture width and n represents the transverse mode order. The wave number in propagation direction βx can remain unchanged as reflected in Equation 2.

$$\beta_x = \frac{2\pi}{\lambda}. \quad \text{(Equation 2)}$$

Using orthogonal wave number vector superposition, the wave number value βn and frequency fn of each transverse mode can be estimated using Equations 3 and 4, respectively.

$$\beta_{n,trans} = 2\pi \sqrt{\left(\frac{n+1}{2 \cdot w_a}\right)^2 + \left(\frac{1}{\lambda}\right)^2}, \quad \text{(Equation 3)}$$

$$f_{n,trans} = \frac{v_p}{\lambda} \sqrt{1 + \left(\frac{(n+1)/2}{w_a/\lambda}\right)^2}. \quad \text{(Equation 4)}$$

Figure 2:
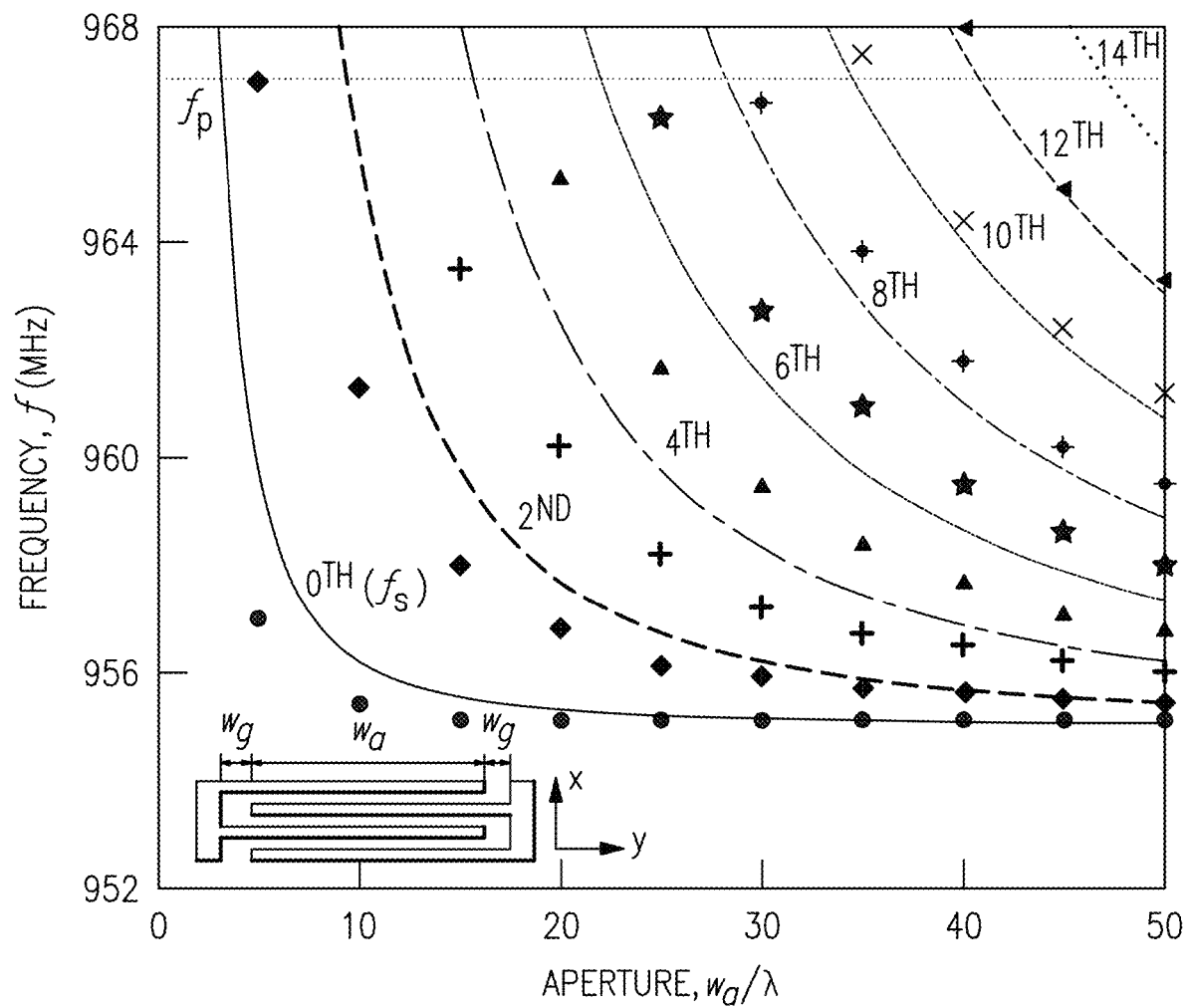
FIG. 2 is a graph that illustrates spectra of the theoretical transverse spurious resonances as a function of aperture width in lines and finite element method (FEM) simulated cases in dots.

FIG. 2 is a graph that illustrates spectra of the theoretical transverse spurious resonances as a function of aperture width in lines and finite element method (FEM) simulated cases in dots. FIG. 2 shows the theoretical curves from Equation 4 and FEM simulated cases. The longer the normalized active region $w_A/\lambda$, the more transverse mode should be in passband, but with smaller amplitude because of inter energy dissipation. The FEM simulated frequencies are lower than theoretical, which can be because the inactive regions such as the bus bar and gap are taken into account. A longer aperture can bring in more transverse modes and $k^2_{eff}$ can degrade for too-short aperture as $f_s$ shifted to higher.

Figure 3:
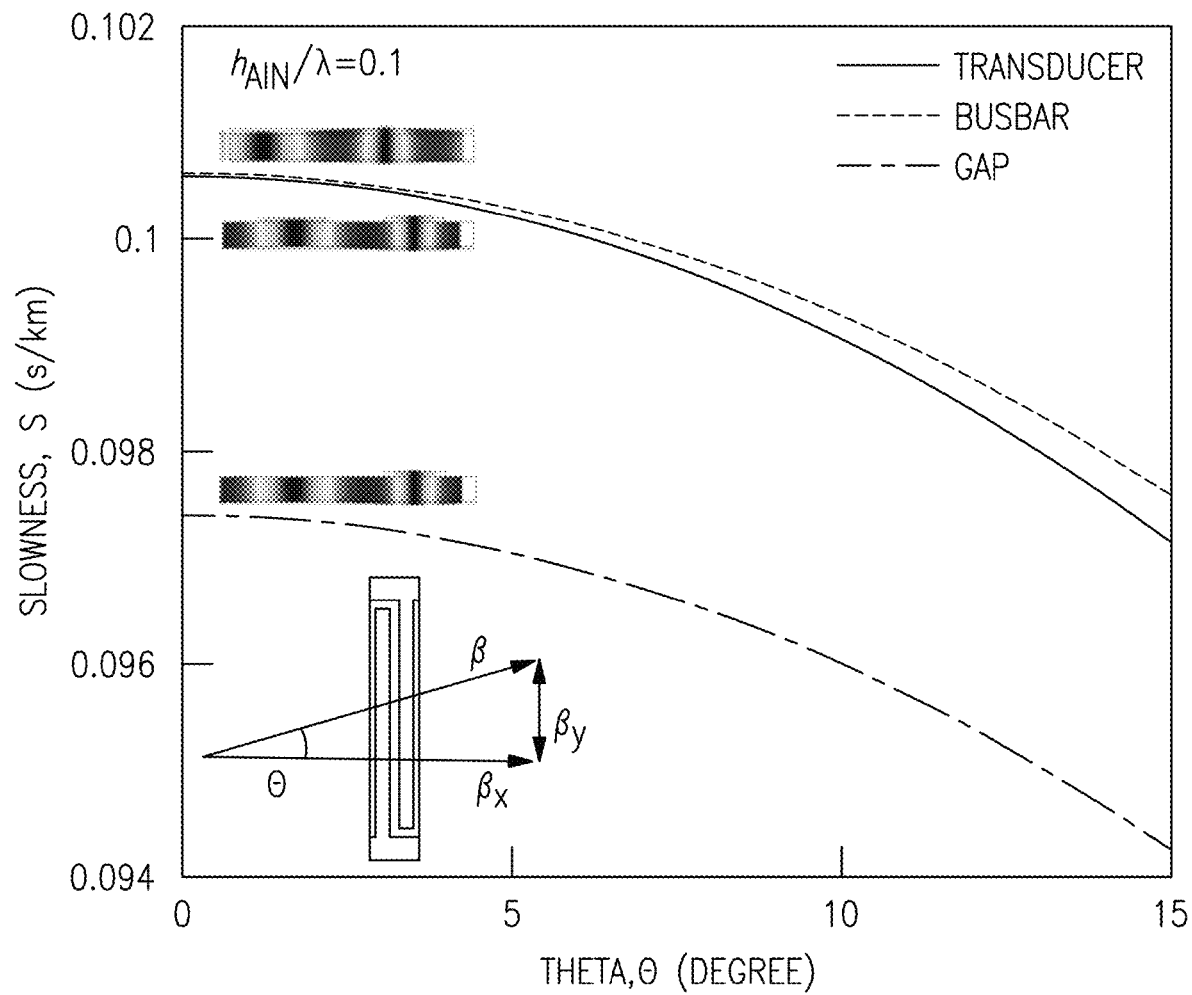
FIG. 3 is a graph that illustrates a slowness curve of the transducer region, gap region, and bus bar region for the S0 mode of a Lamb wave resonators in aluminum nitride.

FIG. 3 is a graph that illustrates a slowness curve of the transducer region, gap region, and bus bar region for the S0 mode of a Lamb wave resonators in aluminum nitride. The slowness curve corresponds to a case where the height of the aluminum nitride layer is 0.1λ, wherein λ is a wavelength of the Lamb wave resonator. The degree θ monotonically increases with frequency for the transducer, bus bar, and gap regions in FIG. 3. This indicates that t the S0 Lamb wave exhibits a convex slowness curve feature in all regions.

Usually for a wave with a convex slowness curve to be trapped, a faster region is desired at the lateral end to guide the wave. For temperature compensated surface acoustic wave (TCSAW) resonators on $SiO_2/LiNO_3$, the faster gap region can help trap energy. For Quartz resonators, the faster bus bar region performing wave guiding. However, for the $S_0$ mode Lamb wave mode, the gap region exhibits too of a high phase velocity to make the wave guiding function as desired at the transducer/gap interface. Also, as the bus bar region has phase velocity close to the transducer region, the wave guiding can be close to the bus bar/gap interface. Accordingly, by modifying the gap region width $w_g$, the energy trapping should not have much impact. Unlike the TCSAW that has a larger Q for wider gap, the energy loss of $S_0$ mode Lamb wave resonator is not typically dependent on the gap width. Rather, the gap width can have direct impact on the transverse mode amplitude for an $S_0$ mode Lamb wave resonator.

Figure 4:
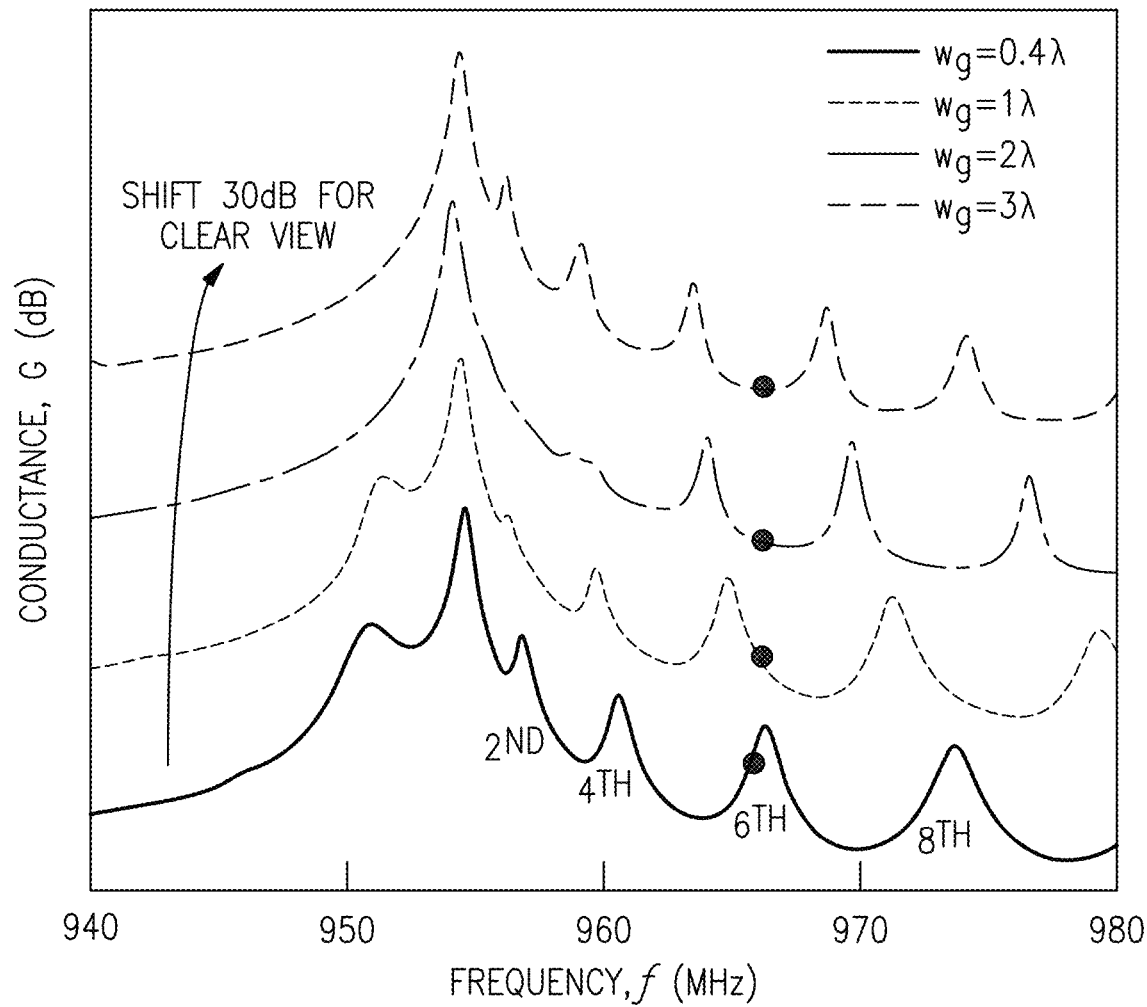
FIG. 4 is a graph that illustrates a comparison of a FEM simulated conductance with different normalized gap widths.

FIG. 4 is a graph that illustrates a comparison of a FEM simulated conductance with different normalized gap widths wg. FIG. 4 depicts the simulated conductance of S0 mode Lamb wave resonators with different gap widths using FEM. When wg/λ is 2, the transverse mode level can become minimized. For slightly larger wg, the effective active region got stretched a little bit so that each transverse mode got smaller Q and lower frequency, especially the first two modes 2nd and 4th. When the gap becomes too large, the increase in the $k^2_{eff}$ should overcome the Q decrease, resulting in larger amplitude.

For the type I modes, by adding a relatively small border region with a relatively slow velocity on the edge of the acoustic aperture, a propagating mode can have a zero transverse wave vector in the active aperture. The transverse wave vector is real in the border region and imaginary on the gap region. One embodiment of the border region includes using a larger metal coverage ratio electrode in the border region. This can be a "hammer head" shape in the border region in plan view. FIG. 5B illustrates an example of an interdigital transducer (IDT) of a Lamb wave resonator with such an electrode.

Figure 5A:
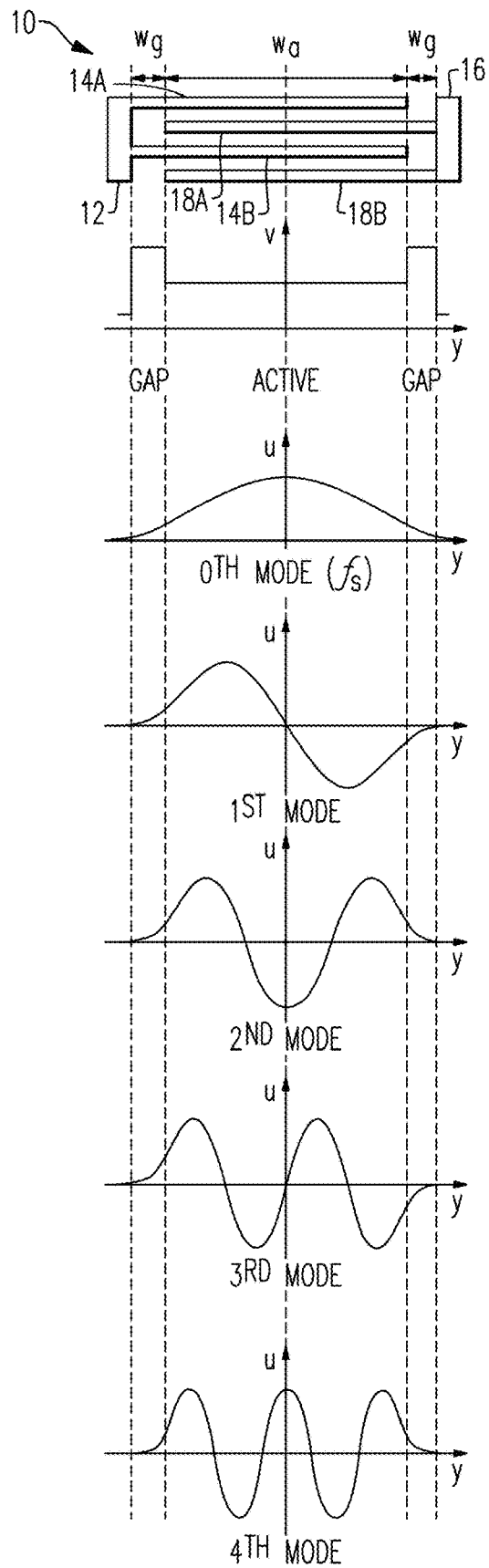
FIGS. 5A and 5B compare a velocity profile and displacement profiles of a traditional Lamb wave resonator and a piston mode Lamb wave resonator.
Figure 5B:
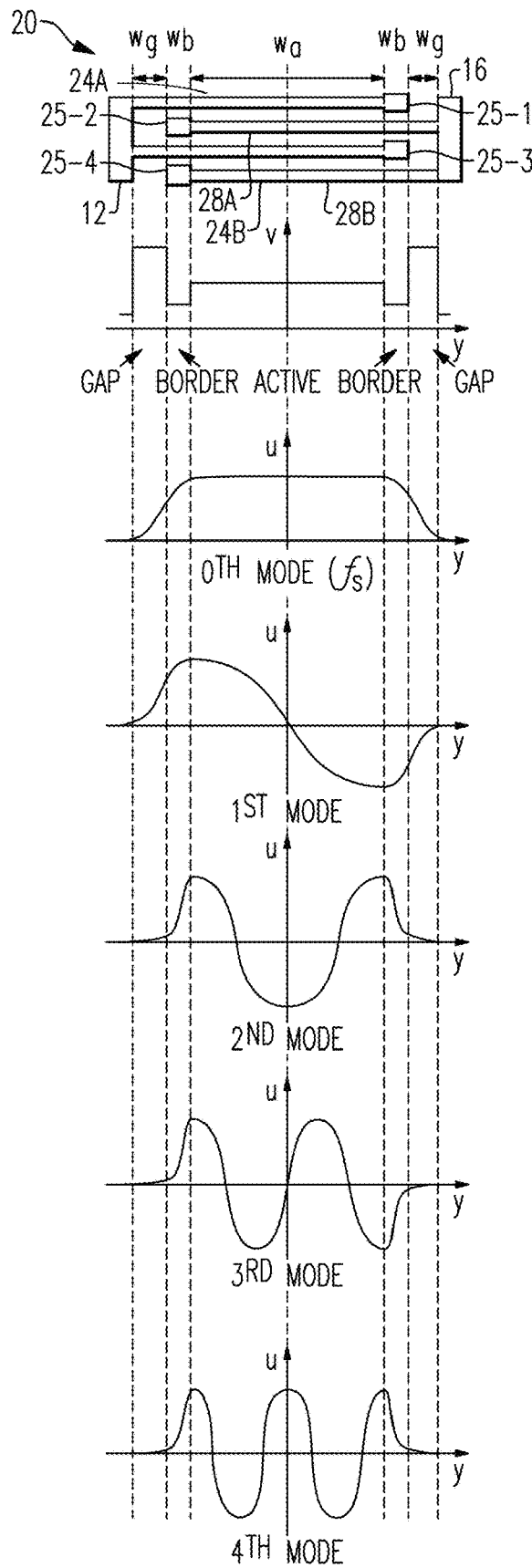

FIGS. 5A and 5B compare a velocity profile and displacement profiles of a traditional Lamb wave resonator and a piston mode Lamb wave resonator. These profiles correspond to aluminum nitride Lamb wave resonators. FIG. 5A illustrates an IDT 10 of a traditional Lamb wave resonator and a corresponding velocity profile and displacement profiles. FIG. 5B illustrates an IDT 20 of a piston mode Lamb wave resonator and a corresponding velocity profile and displacement profiles.

The IDT 10 illustrated in FIG. 5A includes a first bus bar 12, first fingers 14A and 14B extending from the first bus bar 12, a second bus bar 16, and second fingers 18A and 18B extending from the second bus bar 16. In FIG. 5A, the first fingers 14A and 14B have the same width along a length wa of an active region and a length wg of a gap region. Similarly, the second fingers 18A and 18B have the same width along a length wa of an active region and a length wg of a gap region in FIG. 5A.

The IDT 20 illustrated in FIG. 5B is an example of an IDT for a piston mode Lamb wave resonator according to an embodiment. The IDT 20 includes a first bus bar 12, first fingers extending from the first bus bar 12, a second bus bar 16, and second fingers extending from the second bus bar 16. The IDT 20 can be implemented with any suitable number of fingers.

Each of the first fingers includes a body portion 24A or 24B extending from the first bus par 12 in an active region and an end portion 25A or 25B in a border region opposite the first bus bar 12. The end portions 25A and 25B include thicker metal than the body potions 24A and 24B, respectively, of the first fingers. This can result in a slower velocity in the border region than in the active region. Similarly, each of the second fingers includes a body portion 28A or 28B extending from the second bus par 16 in the active region and an end portion 29A or 29B in a border region opposite the second bus bar 16. The end portions 29A and 29B include thicker metal than the body potions 28A and 28B, respectively, of the second fingers. This can result in a slower velocity in the border region than in the active region.

As illustrated in FIG. 5B, the first fingers are thicker in a border region along a length wb than in the active region along length wa. The first fingers are also thicker in the border region than in a gap region along length wg in the IDT 20. Similarly, in the IDT 20, the second fingers are thicker in a border region along a length wb than in a remainder of the active region along length wa. The second fingers are also thicker in the border region than in a gap region along length wg in the IDT 20. The fingers include respective end portions 24A, 24B, 29A, and 29B in border regions. The end portions 24A, 24B, 29A, and 29B have a hammer head shape in border regions in FIG. 5B.

FIGS. 5A and 5B compare the velocity profiles of a traditional Lamb wave resonator with the IDT 10 and a piston mode Lamb wave resonator with the IDT 20. As shown in FIGS. 5A and 5B, the Lamb wave resonator that includes IDT 20 has a reduced velocity in border regions compared to the gap regions and the active region. In FIG. 5B, the reduced velocity in the border region is caused by the end portions 25-1, 25-2, 25-3, and 25-4 of the IDT 20.

FIGS. 5A and 5B also compare the displacement profiles $u_{y,n}$ of the nth transverse mode for n=0, 1, 2, 3, and 4 in a traditional Lamb wave resonator with the IDT 10 and displacement profiles $u_{y,n}$ of the a piston mode Lamb wave resonator with the IDT 20. As shown in FIGS. 5A and 5B, the velocity profiles for even order modes have a slope with a greater magnitude corresponding to the border region of the IDT 20 of FIG. 5B than in the corresponding portion of the active region of the IDT 10 of FIG. 5A. For the traditional Lamb wave resonator with the IDT 10, approximately an extra half wave lengths fits to the active region for even modes. This can lead to non-vanishing coupling. In the piston mode Lamb wave resonator with the IDT 20, the even order modes that have a multiple of full wave lengths in the active region should not meaningfully couple to the electrical domain. Accordingly, FIGS. 5A and 5B indicate that the IDT 20 can suppress transverse modes more effectively than the IDT 10.

Figure 6:
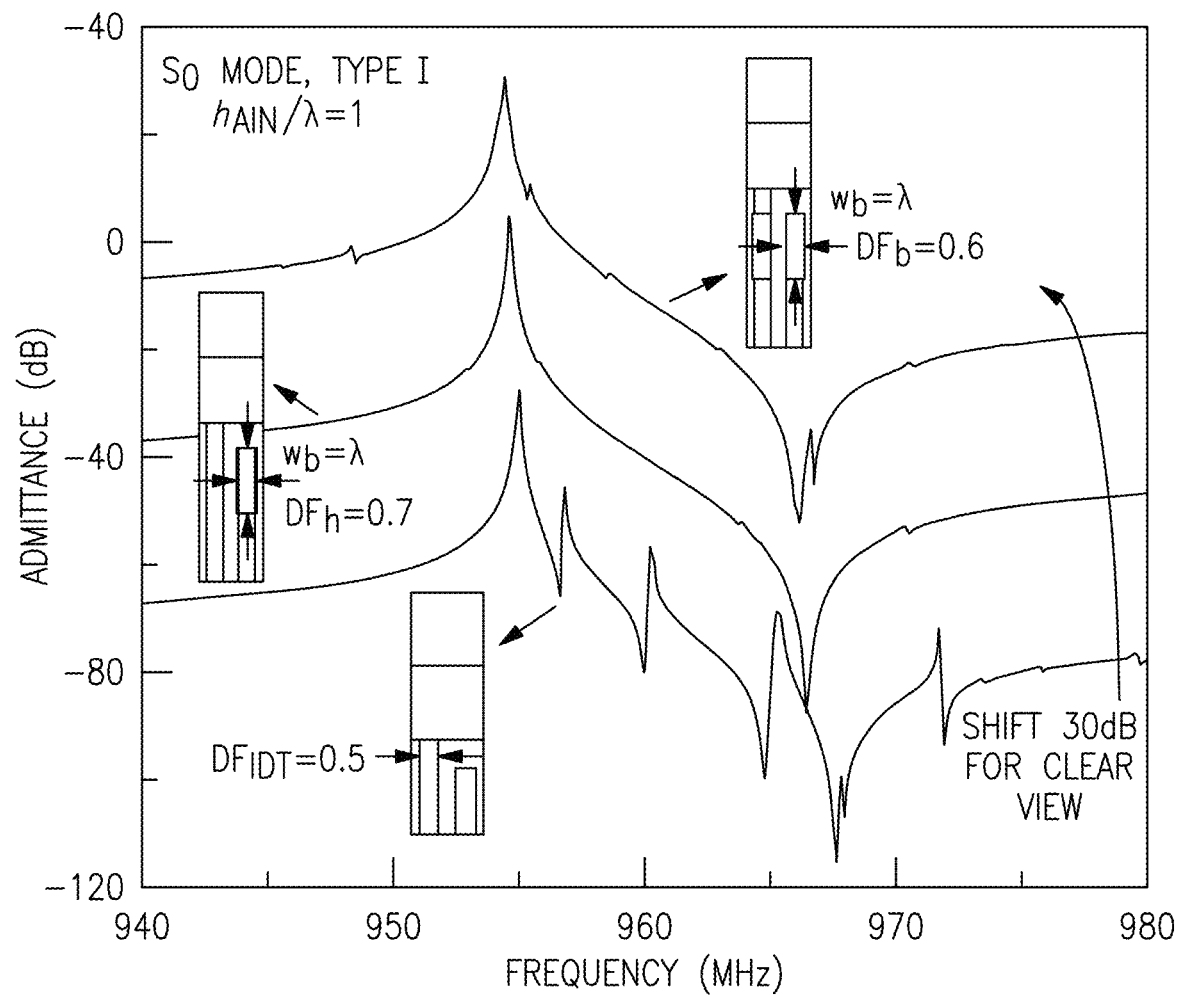
FIG. 6 is a graph that includes a comparison of the FEM simulated frequency response for S0 mode Lamb wave resonators with two types of hammer-head IDTs for piston mode according to embodiments and a traditional IDT.
Figure 7:
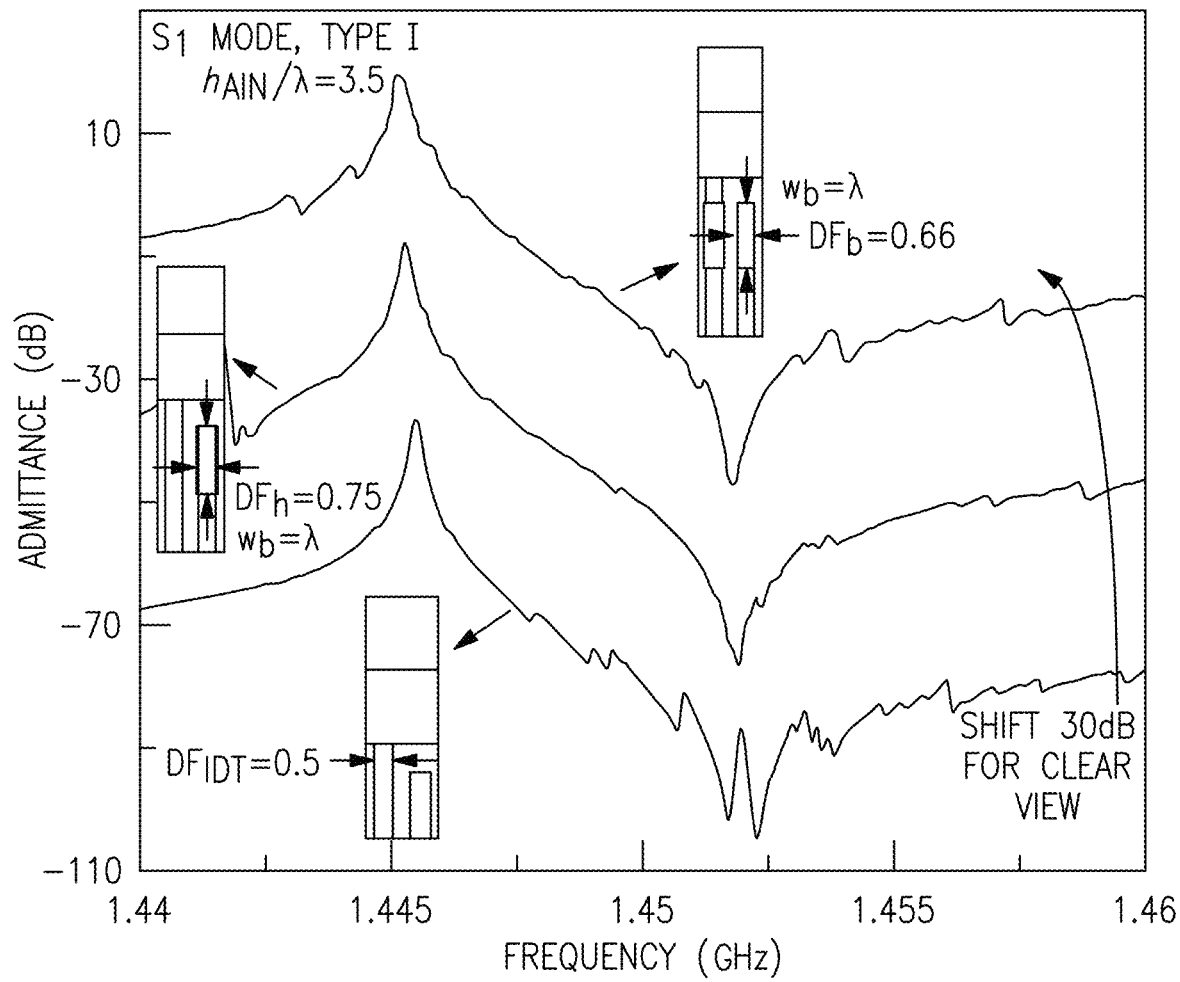
FIG. 7 is a graph that includes a comparison of the FEM simulated frequency response for type I $S_1$ mode Lamb wave resonators with two types of hammer-head IDTs for piston mode according to embodiments and a traditional IDT.

FIGS. 6 and 7 are graphs that show FEM simulated frequency responses for $S_0$ mode and type I $S_1$ mode Lamb wave resonators. These graphs each include two curves corresponding to Lamb wave resonators with different types of hammer-head IDTs for piston mode and a third curve corresponding to Lamb wave resonator with a traditional IDT. FIG. 6 is a graph that includes a comparison of the FEM simulated frequency response for S0 mode Lamb wave resonators with two types of hammer-head IDTs for piston mode according to embodiments and a traditional IDT. FIG. 7 is a graph that includes a comparison of the FEM simulated frequency response for type I $S_1$ mode Lamb wave resonators with two types of hammer-head IDTs for piston mode according to embodiments and a traditional IDT. By carefully designing a metal ratio, which corresponds to the reduction in phase velocity together with the border length $w_b$, the amplitude of the transverse modes in $S_0$ mode and type I $S_1$ mode in a piston mode Lamb wave resonator can be effectively reduced and/or eliminated in the electrical response of the piston mode Lamb wave resonator.

Assuming the phase velocity difference between the gap region $v_{p,g}$ and active region $v_{p,a}$ is invariant, the desired optimum normalized border width $w_b/\lambda$, can be proportional to the normalized velocity difference between the border region and active region, independent from aperture length $w_a$ as reflected in Equation 5.

$$\frac{w_b}{\lambda} \propto \frac{v_{p,a} - v_{p,b}}{v_{p,a}}. \quad \text{(Equation 5)}$$

Figure 8:
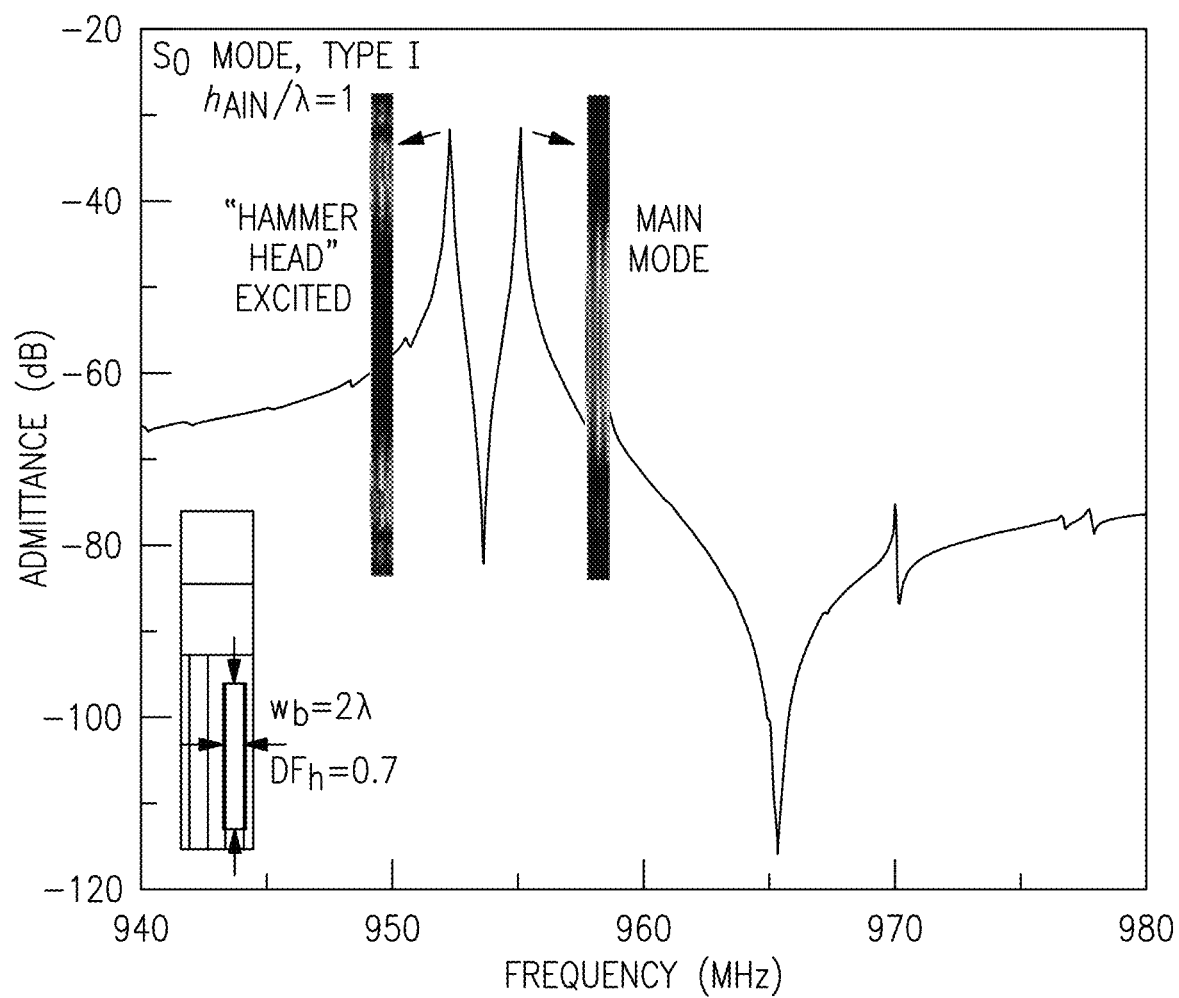
FIG. 8 is a graph of a FEM simulated admittance for a piston mode device with a border region width that is larger than typically desired.

FIG. 8 is a graph of a FEM simulated admittance for a piston mode device with a border region length that is larger than typically desired. FIG. 8 shows the admittance of a $S_0$ mode piston mode Lamb wave resonator when the length wb of the border region is larger than typically desired. In this case, the hammer head no longer works just as the wave field modification region, but as the transducer itself. Thus, another resonance is excited by the hammer head at frequency that is slightly lower than the main mode due to the larger duty factor. This can result in the response being split into two resonance peaks. As shown in the inset of FIG. 8, the resonance displacement of the first peak happens right at the hammer head region and for the main mode the effective active region is reduced to a length of the length of the active region wa minus two times the length of the border region wb (i.e., to a length represented by $w_a - 2w_b$).

For Lamb wave devices on aluminum nitride, the transverse modes are relatively strong in the large-$k^2$eff type I modes. The dispersion characteristics for the first four Lamb wave modes have been studied. Except for part of the S1 mode, most Lamb wave modes exhibit positive group velocity and type I dispersion. By wave vector superposition, the active region width wa is found to determine the transverse mode frequency. The slowness curve indicates that the gap region width wg in S0 Lamb wave resonators does not play a significant role in wave guiding and energy trapping, and instead can provide a relatively small impact on transverse mode strength.

The piston mode for type I Lamb wave modes created by including a slow border region at the edge of the active aperture can reduce and/or eliminate the transverse modes. At the same time, the slow border region may not introduce degradations. The FEM simulated aluminum nitride S0 and type I S1 mode Lamb wave resonators using hammer head type border regions that enable piston mode can exhibit spurious free operation. These spurious free, high Q, and large $k^2$eff Lamb wave resonators enable single-chip filters, oscillators and sensors with desirable performance characteristics.

Figure 9A:
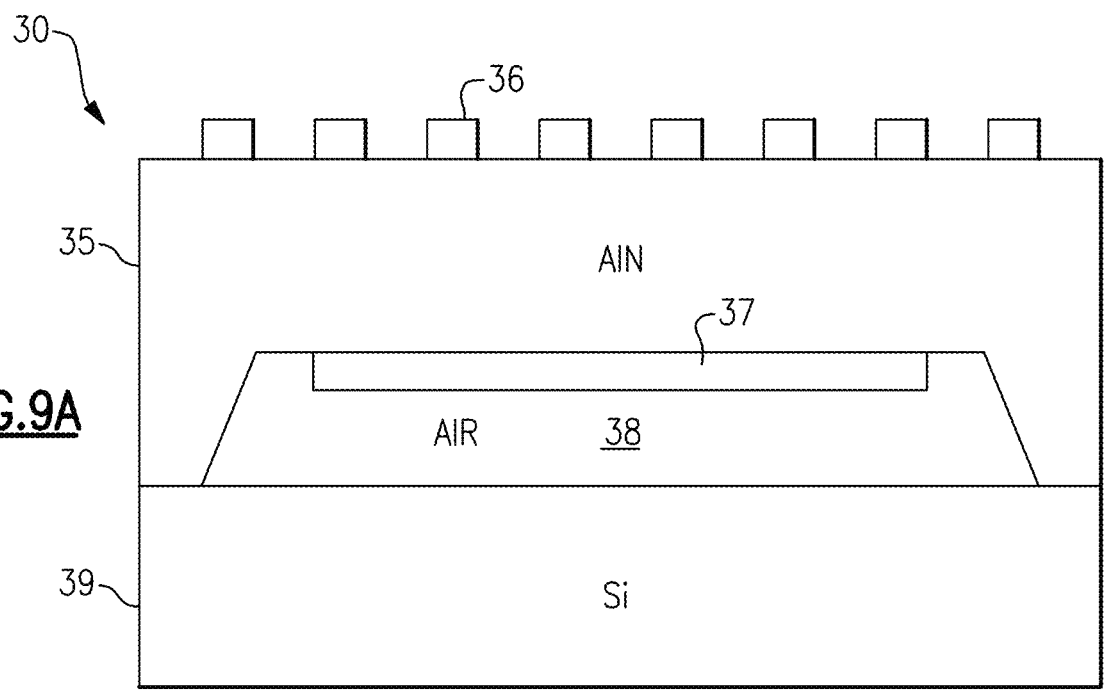
FIG. 9A is a diagram cross section of a Lamb wave resonator according to an embodiment.
Figure 9B:
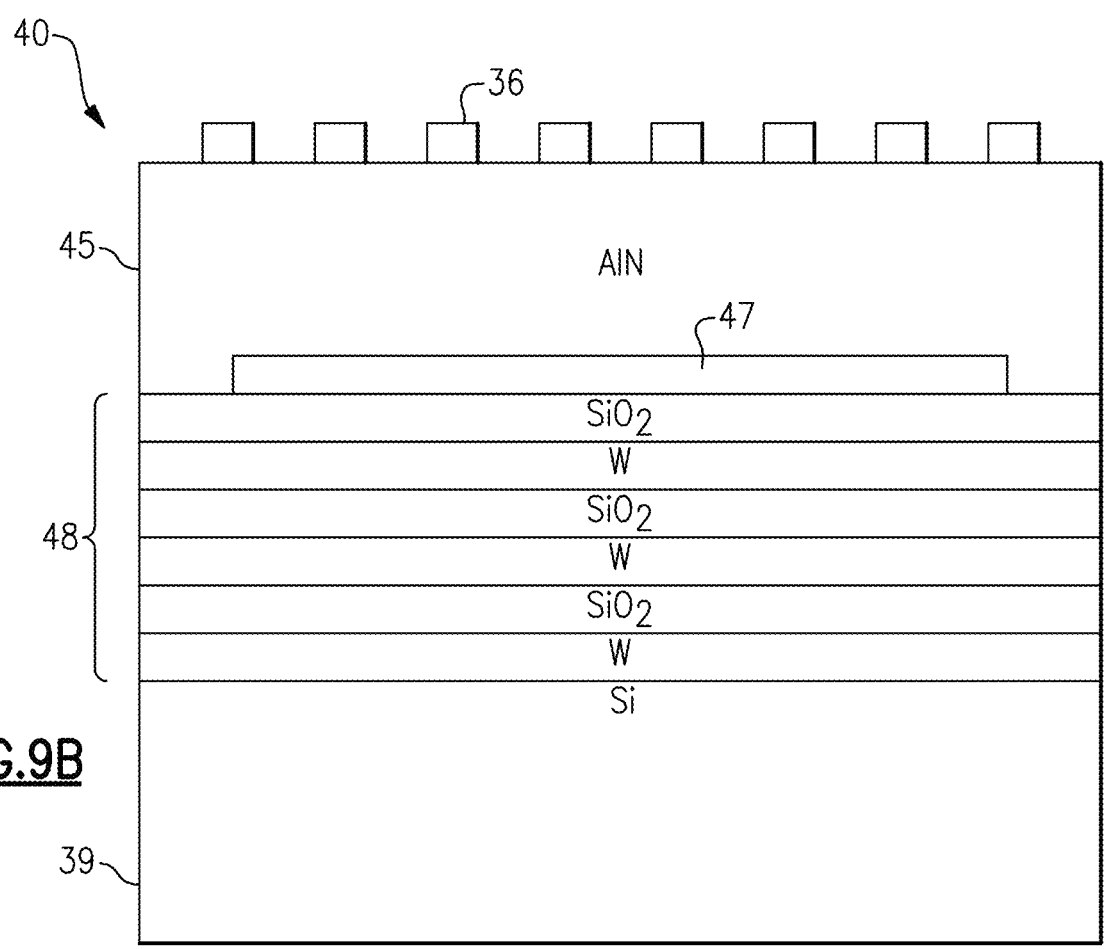
FIG. 9B is a diagram of cross section of a Lamb wave resonator according to another embodiment.

FIGS. 9A and 9B are diagrams of cross sections of example Lamb wave resonators. These Lamb wave resonators can be piston mode Lamb wave resonators that include IDTs in accordance with any suitable principles and advantages disclosed herein.

FIG. 9A is a diagram of cross section of a Lamb wave resonator 30 according to an embodiment. The Lamb wave resonator 30 includes feature of a SAW resonator and an FBAR. As illustrated, the Lamb wave resonator 30 includes a piezoelectric layer 35, an IDT 36 on the piezoelectric layer 35, an electrode 37, an air cavity 38, and a semiconductor substrate 39. The piezoelectric layer 35 can be a thin film. The piezoelectric layer 35 can be an aluminum nitride layer as illustrated. Alternatively, the piezoelectric layer 35 can be any other suitable piezoelectric layer. In certain instances, the piezoelectric layer 35 can be a lithium niobate layer or a lithium tantalate layer. The frequency of the Lamb wave resonator can be based on the geometry of the IDT 36. The electrode 37 can be grounded in certain instances. In some other instances, the electrode 37 can be floating. An air cavity 38 is disposed between the electrode 37 and a semiconductor substrate 39. The semiconductor substrate 39 can be a silicon substrate as illustrated. Any suitable cavity can be implemented in place of the air cavity 38.

The Lamb wave resonator 30 includes a border region on an edge of the acoustic aperture in which the border region has a slower velocity that an active region of the Lamb wave resonator 30. The border region can suppress transverse modes of the Lamb wave resonator 30. The border region can achieve a slower velocity than the active region due to characteristics of the IDT 36 and/or one or more layers adjacent to the IDT 36. Example Lamb wave resonators that implement a border region that have a slower velocity than the active region will be discussed with reference to FIG. 10A to 10J. Any suitable principles and advantages of these example Lamb wave resonators can be implemented in the Lamb wave resonator 30.

FIG. 9B is a diagram of cross section of an acoustic wave device 40 that includes a Lamb wave resonator 40 according an embodiment. The Lamb wave resonator 40 is a solidly mounted Lamb wave resonator. The Lamb wave resonator 40 is also a piston mode Lamb wave resonator. The Lamb wave resonator 40 includes feature of a SAW resonator and a solidly mounted resonator (SMR). The Lamb wave resonator 40 includes an acoustic mirror below a lower electrode.

As illustrated, the Lamb wave resonator 40 includes a piezoelectric layer 45, an IDT 36 on the piezoelectric layer 45, an electrode 47, Bragg reflectors 48, and a semiconductor substrate 39. The piezoelectric layer 45 can be an aluminum nitride layer. Alternatively, the piezoelectric layer 45 can be any other suitable piezoelectric layer, such as a lithium niobate ($LiNO_3$) layer or a lithium tantalate ($LiTaO_3$) layer. The frequency of the Lamb wave resonator can be based on the geometry of the IDT 36. The electrode 47 can be grounded in certain instances. In some other instances, the electrode 47 can be floating. The Bragg reflectors 48 function as an acoustic mirror. Any other suitable acoustic mirror can be implemented in place of the Bragg reflectors 48. Bragg reflectors 48 are disposed between the electrode 47 and a semiconductor substrate 39. Any suitable Bragg reflectors can be implemented. For example, the Bragg reflectors can be silicon dioxide/tungsten ($SiO_2$/W). The semiconductor substrate 39 can be a silicon substrate.

The Lamb wave resonator 40 includes a border region on an edge of the acoustic aperture in which the border region has a slower velocity that an active region of the Lamb wave resonator 40. The border region can suppress transverse modes of the Lamb wave resonator 40. The border region can achieve a slower velocity than the active region due to characteristics of the IDT 36 and/or one or more layers adjacent to the IDT 36. Example Lamb wave resonators that implement a border region that have a slower velocity than the active region will be discussed with reference to FIG. 10A to 10J. Any suitable principles and advantages of these example Lamb wave resonators can be implemented in the Lamb wave resonator 40.

Piston mode Lamb wave resonators can be implemented in a variety of ways. As an example, a metal layout of an interdigital transducer of a Lamb wave resonator can contribute to a velocity in a border region having a lower magnitude than a velocity in an active region. For instance, an end portion of an interdigital transducer electrode finger can have wider metal than the rest of the finger. Alternatively or additionally, a bus bar can have a lower metal coverage ratio adjacent to an end portion of an interdigital transducer finger. As another example, a layer over an interdigital transducer electrode can contribute to a velocity in a border region having a lower magnitude than a velocity in an active region. Such a layer can be over the active region to increase the magnitude of the velocity in the active region relative to the border region. Alternatively or additionally, a layer over the border region can reduce the velocity of the border region relative to the active region. Example embodiments of piston mode Lamb wave resonators will be discussed with reference to FIGS. 10A to 10J. In the Lamb wave resonators of any of FIGS. 10A to 10J, an IDT can be on aluminum nitride piezoelectric layer. Any suitable principles and advantages of these embodiments can be combined with each other. Any suitable principles and advantages of these embodiments can be implemented in a piston mode Lamb wave resonator.

Figure 10A:
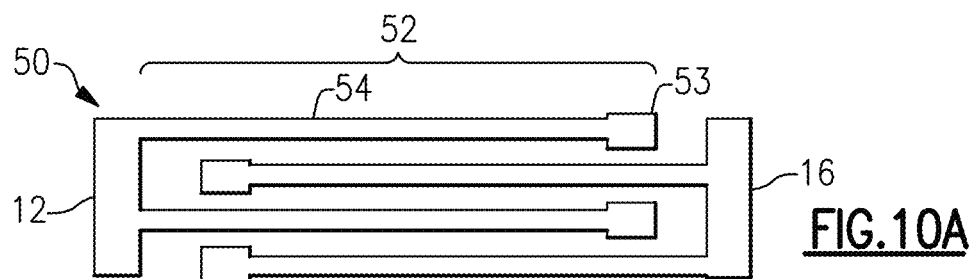
FIGS. 10A to 10J are diagrams of IDTs of piston mode Lamb wave resonators according to various embodiments.

FIG. 10A illustrates an IDT 50 of a piston mode Lamb wave resonator according to an embodiment. The IDT 50 includes fingers having hammer head shaped end portions. The IDT 50 includes bus bars 12 and 16 and a plurality of fingers extending from the bus bars 12 and 16. As illustrated, each of the fingers of the IDT 50 are substantially the same. Finger 52 will be discussed as an example. Finger 52 has a body portion 54 that extends from bus bar 12 and an end portion 53. The end portion 53 is adjacent to the bus bar 16. The end portion 53 is wider that the rest of the finger 52. The end portion 53 is hammer head shaped in plan view. The end portions of the fingers of the IDT 50 can make the Lamb wave resonator a piston mode Lamb wave resonator.

Figure 10B:
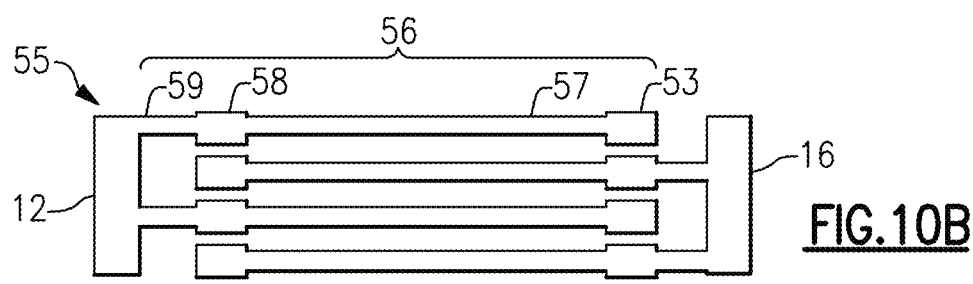

FIG. 10B illustrates an IDT 55 of a piston mode Lamb wave resonator according to another embodiment. The IDT 55 has with thicker portions for both border regions of each finger. The IDT 55 is like the IDT 50 of FIG. 10A except that the fingers of the IDT 55 are wider adjacent to both bus bars 12 and 16. Finger 56 will be discussed as an example. Finger 56 has a bus bar connection portion 59 that extends from bus bar 12, a widened portion 58, a body portion 57, and an end portion 53. Both the end portion 53 and the widened portion 58 are wider than the other portions of the finger 56. The widened portion 58 and the end portion 53 of the finger 56 are included in border regions on opposing sides of the active region of the Lamb wave resonator that include the IDT 55. The end portions and widened portions of the fingers of the IDT 55 can make the Lamb wave resonator a piston mode Lamb wave resonator.

Figure 10C:
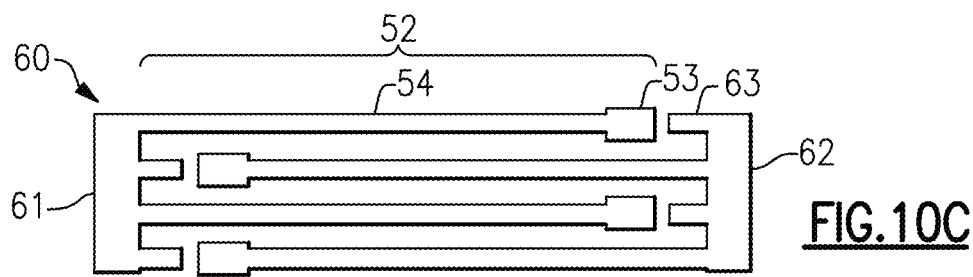

FIG. 10C illustrates an IDT 60 of a piston mode Lamb wave resonator according to another embodiment. The IDT 60 includes fingers having hammer head shaped end portions and bus bars having extension portions adjacent to the end portions of the fingers. The IDT 60 is like the IDT 50 of FIG. 10A except that the bus bars of the IDT 60 have extension portions adjacent to end portions of fingers. Bus bars 61 and 62 each include extension portions, such as extension portion 63, adjacent to end portions of fingers of the IDT 60. The Extension portions of the bus bars 61 and 62 can increase the metal coverage ratio around the border regions relative to the active region of the Lamb wave resonator. The end portions of the finger and extension portions of the bus bars of the IDT 60 can make the Lamb wave resonator a piston mode Lamb wave resonator.

Figure 10D:
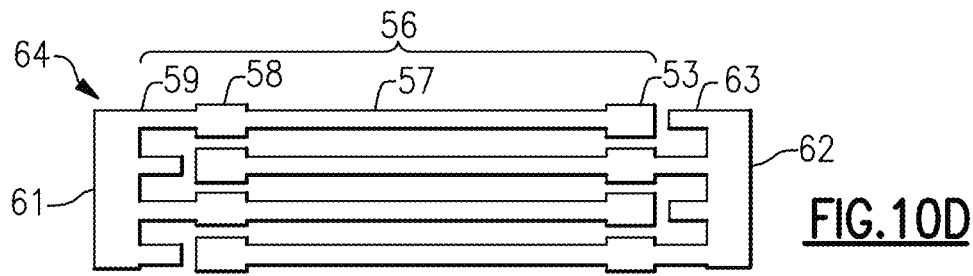

FIG. 10D illustrates an IDT 64 of a piston mode Lamb wave resonator according to another embodiment. The IDT 64 has thicker end portions on border regions of each finger and bus bars having extension portions adjacent to end portions of the fingers. The IDT 64 includes features of the IDT 56 of FIG. 10C and the IDT 55 of FIG. 10B.

Figure 10E:
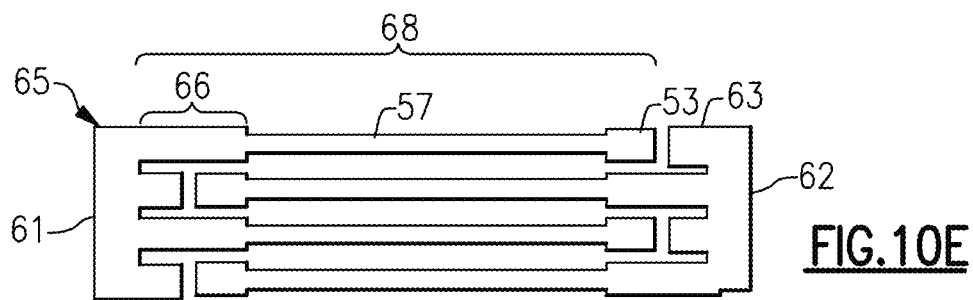

FIG. 10E illustrates an IDT 65 of a piston mode Lamb wave resonator according to another embodiment. The IDT 65 includes fingers having thicker end portions and thicker regions extending from a bas bar toward an active region of the Lamb wave resonator. The IDT 65 is similar to the IDT 60 of FIG. 10C except the fingers of IDT 65 include a widened portion extending from bus bars. As shown in FIG. 10E, finger 68 of the IDT 65 includes widened portion 66 extending from the bus bar 61 to body portion 57. The finger 68 also includes end portion 53.

Figure 10F:

FIG. 10F illustrates an IDT 70 of a piston mode Lamb wave resonator according to another embodiment. The IDT 70 includes with bus bars 72 and 74 and fingers 73 and 75 extending from the respective bus bars. The bus bars 72 and 74 have holes 76 and 77, respectively. The holes 76 and 77 are adjacent to ends of the fingers 75 and 73, respectively. The holes can reduce a metal coverage ratio adjacent to border regions of the piston mode Lamb wave resonator.

Figure 10G:

FIG. 10G illustrates an IDT 80 of a piston mode Lamb wave resonator according to another embodiment. The IDT 80 is like the IDT 70 of FIG. 10F except that the bus bars have different holes. As illustrated in FIG. 10G, the IDT 80 includes bus bars 82 and 84 having holes 86 and 88, respectively.

Figure 10H:
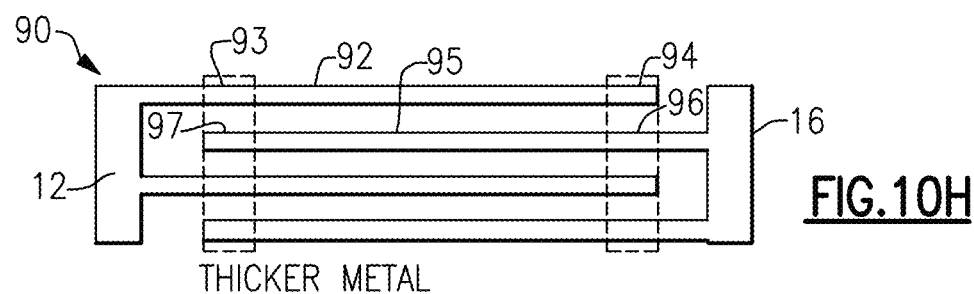

FIG. 10H illustrates an IDT 90 of a piston mode Lamb wave resonator according to another embodiment. The IDT 90 includes bus bars 12 and 16 and fingers 92 and 95 extending from the bus bars 12 and 16, respectively. The finger 92 has thicker metal in border region portions 93 and 94 that the rest of the finger 92. Similarly, the finger 94 has thicker metal in border region portions 96 and 97 than in other portions of the finger 94. Thicker metal can provide similar functionality as wider metal.

Figure 10I:
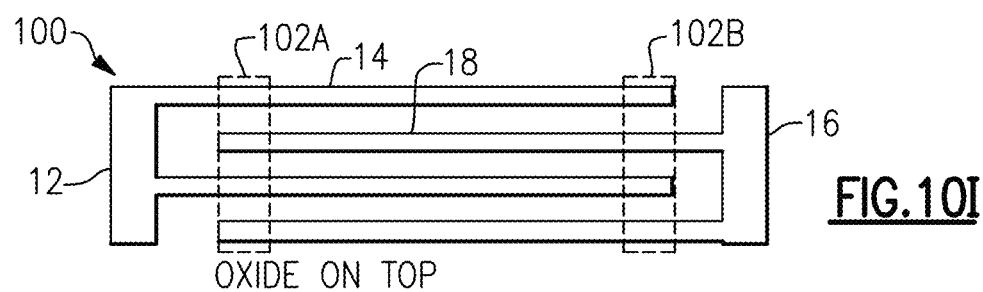

FIG. 10I illustrates an IDT 100 of a piston mode Lamb wave resonator according to an embodiment. The IDT 100 has an oxide over border regions 102A and 102B of the IDT 100. The oxide can cause a magnitude of the velocity in the border regions to be less than the velocity in the active region of the Lamb wave resonator. Any other suitable material can be included over border regions 102A and 102B to reduce the magnitude of the velocity of the border regions relative to the active region.

Figure 10J:
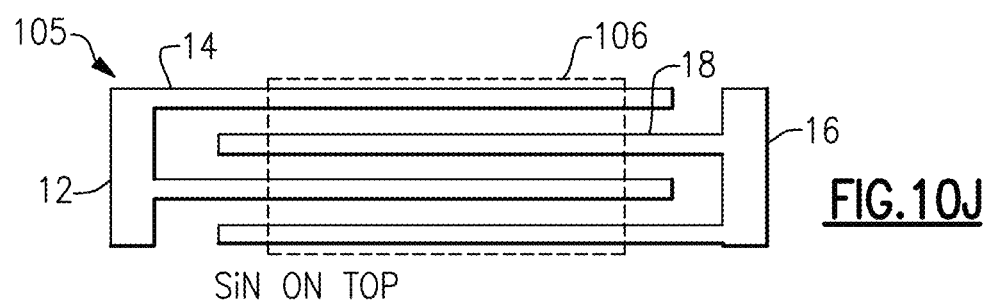

FIG. 10J illustrates an IDT 105 of a piston mode Lamb wave resonator according to another embodiment. The IDT 105 has silicon nitride over active region 106 of the IDT 105. The silicon nitride can cause a magnitude of the velocity in the active region to be greater than the velocity in a border active region of the Lamb wave resonator. Any other suitable material can be included over the active region 106 to increase the magnitude of the velocity of the active region relative to the border regions.

Lamb wave resonators can include an IDT on a piezoelectric layer and reflective gratings disposed on the piezoelectric layer on opposing sides of the IDT. The reflective gratings can reflect acoustic waves induced by the IDT to form a resonant cavity in such resonators. The reflective gratings can include a periodic pattern of metal on a piezoelectric layer. FIGS. 11A to 11F are diagrams of cross sections of Lamb wave resonators with gratings. These Lamb wave resonators are piston mode Lamb wave resonators in accordance with any suitable principles and advantages discussed herein. A piston mode Lamb wave resonator can be implemented with any suitable principles and advantages of any of the Lamb wave resonators of FIGS. 11A to 11F. Although the Lamb wave resonators of FIGS. 11A to 11F are free-standing resonators, any suitable principles and advantages of these Lamb wave resonators can be applied to any other suitable Lamb wave resonators.

Figure 11A:
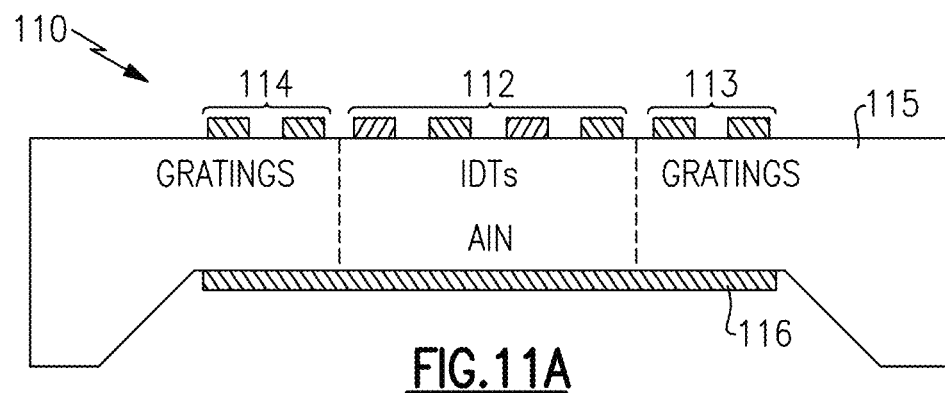
FIGS. 11A to 11F are diagrams of cross sections of Lamb wave resonators with gratings.

FIG. 11A illustrates a Lamb wave resonator 110 that includes an IDT 112, gratings 113 and 114, a piezoelectric layer 115, and an electrode 116. The IDT 112 is on the piezoelectric layer 115. In the illustrated cross section, alternate ground and signal metals are included in the IDTs. Gratings 113 and 115 are on the piezoelectric layer 115 and disposed on opposing sides of the IDTs 112. The illustrated gratings 113 and 115 are shown as being connected to ground. Alternatively, one or more of the gratings can be signaled and/or floating. The electrode 116 and the IDT 112 are on opposite sides of the piezoelectric layer 115. The piezoelectric layer 115 can be AlN, for example. The electrode 116 can be grounded.

Figure 11B:
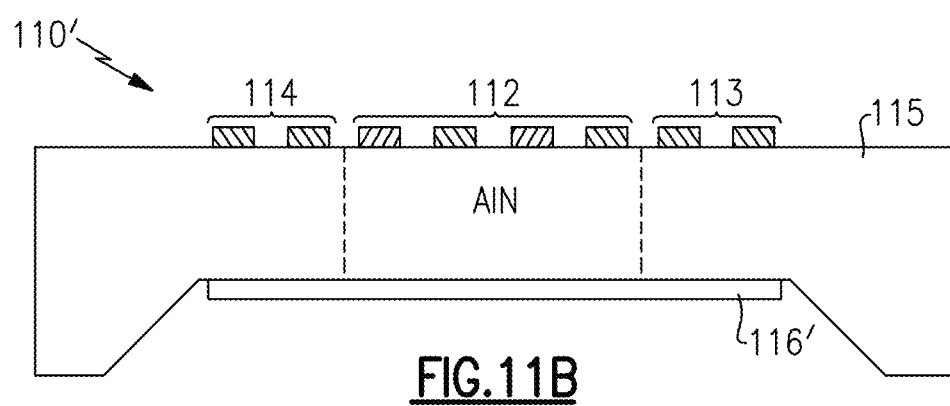

FIG. 11B illustrates a Lamb wave resonator 110'. The Lamb wave resonator 110' is like the Lamb wave resonator 110 of FIG. 11A except that the Lamb wave resonator 110' includes a floating electrode 116'.

Figure 11C:
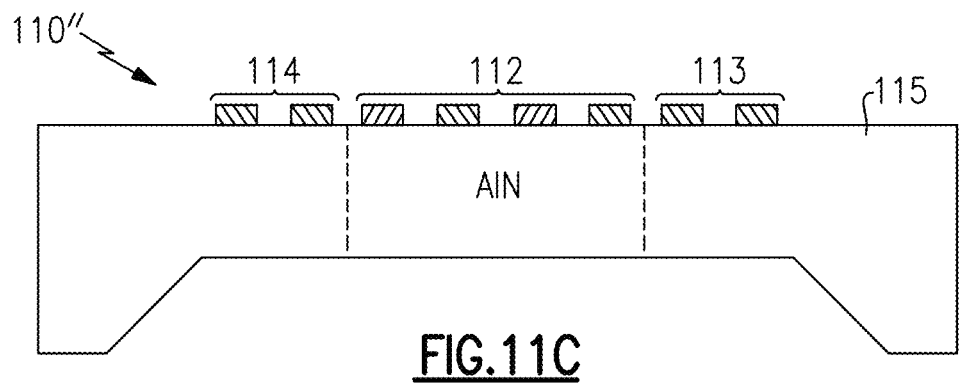

FIG. 11C illustrates a Lamb wave resonator 110" without an electrode on a side of the piezoelectric layer 115 that opposes the IDT 112.

Figure 11D:
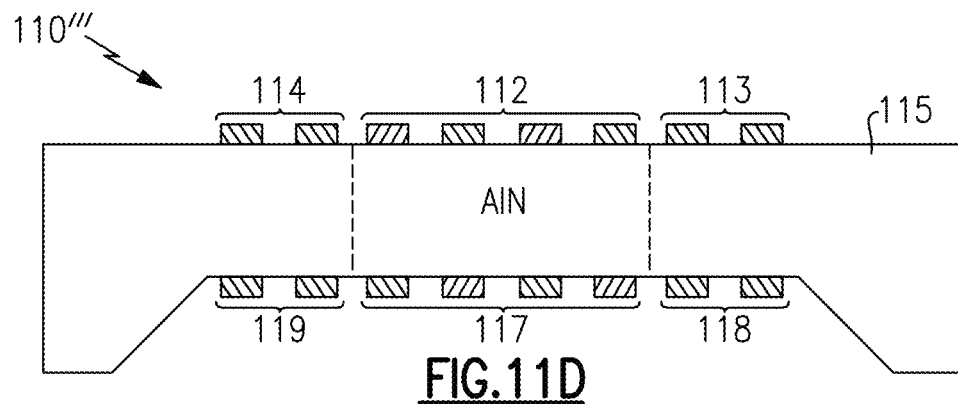

FIG. 11D illustrates a Lamb wave resonator 110''' that includes an IDT 117 and gratings 118 and 119 on a second side of the piezoelectric layer 115 that is opposite to a first side on which the IDT 112 and gratings 113 and 114 are disposed. The signal and ground electrodes are offset relative to each other for the IDTs 112 and 117.

Figure 11E:
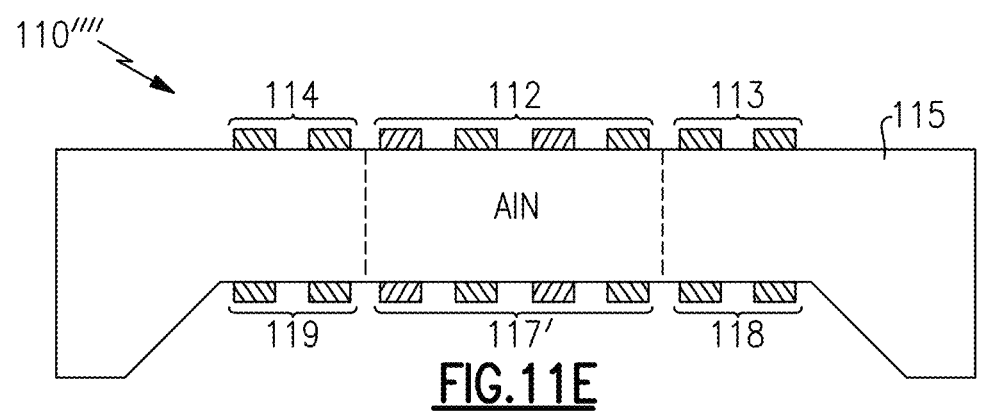

FIG. 11E illustrates a Lamb wave resonator 110'''' that includes an IDT 117' and gratings 118 and 119 on a second side of the piezoelectric layer 115 that is opposite to a first side on which the IDT 112 and gratings 113 and 114 are disposed. The signal and ground electrodes are aligned with each other for the IDTs 112 and 117'.

Figure 11F:
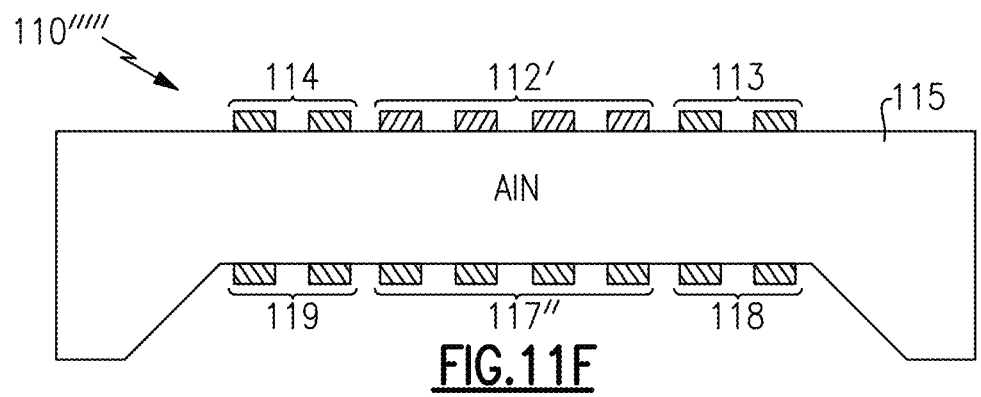

FIG. 11F illustrates a Lamb wave resonator 110''''' that includes an IDT 117" and gratings 118 and 119 on a second side of the piezoelectric layer 115 that is opposite to a first side on which the IDT 112' and gratings 113 and 114 are disposed. In the illustrated cross section, the IDT 112' includes only signal electrodes and the IDT 117" includes only ground electrodes.

Lamb wave resonators can include an IDT with free edges. Suspended free edges of a piezoelectric layer can provide acoustic wave reflection to form a resonant cavity in such resonators. FIGS. 12A to 12F are diagrams of cross sections of Lamb wave resonators with free edges. These Lamb wave resonators are piston mode Lamb wave resonators in accordance with any suitable principles and advantages discussed herein. A piston mode Lamb wave resonator can be implemented with any suitable principles and advantages of any of the Lamb wave resonators of FIGS. 12A to 12F. Although the Lamb wave resonators of FIGS. 12A to 12F are free-standing resonators, any suitable principles and advantages of these Lamb wave resonators can be applied to other Lamb wave resonators.

Figure 12A:
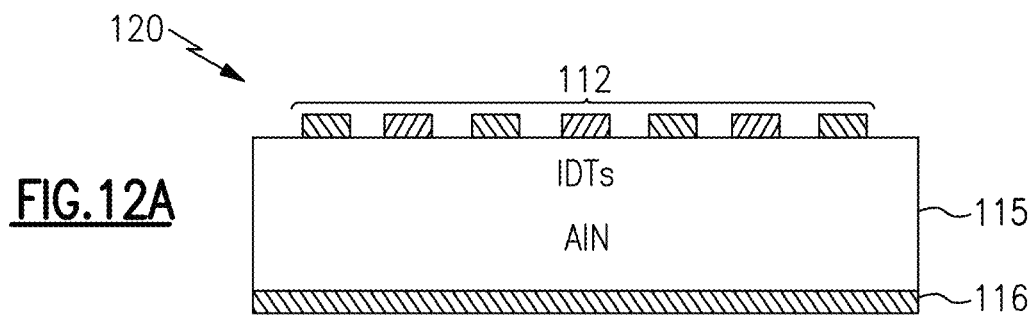
FIGS. 12A to 12F are diagrams of cross sections of Lamb wave resonators with free edges.

FIG. 12A illustrates a Lamb wave resonator 120 that includes IDT 112, piezoelectric layer 115, and electrode 116. The IDT 112 is on the piezoelectric layer 115. In the illustrated cross section, alternate ground and signal electrodes are included in the IDTs. The piezoelectric layer 115 has free edges on opposing sides of the IDT 112. The electrode 116 and the IDT 112 are on opposite sides of the piezoelectric layer 115. The piezoelectric layer 115 can be aluminum nitride, for example. The electrode 116 can be grounded.

Figure 12B:
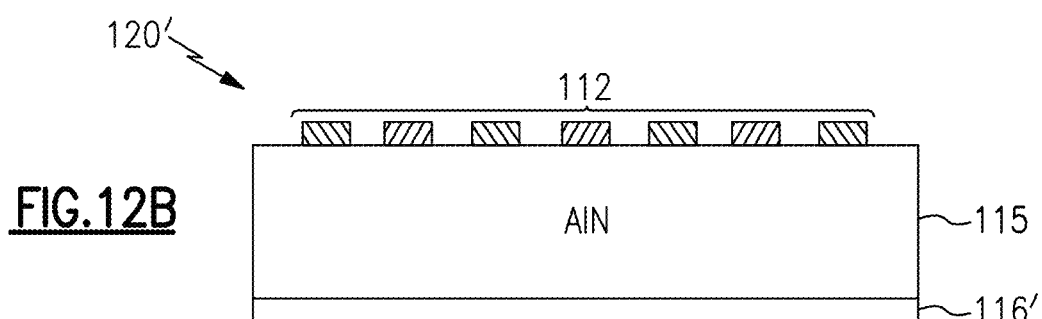

FIG. 12B illustrates a Lamb wave resonator 120'. The Lamb wave resonator 120' is like the Lamb wave resonator 120 of FIG. 12A except that the Lamb wave resonator 120' includes a floating electrode 116'.

Figure 12C:
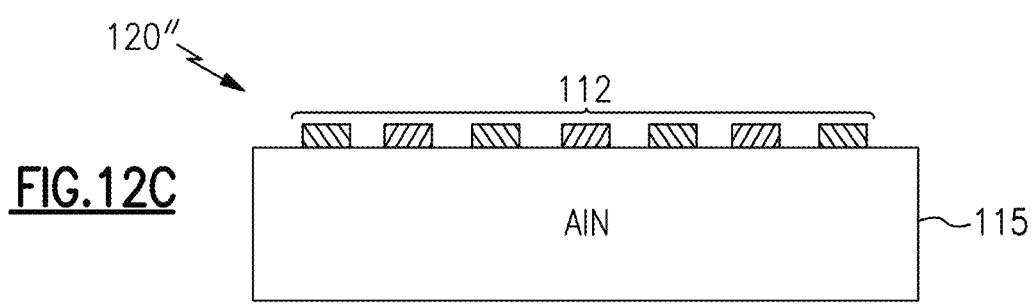

FIG. 12C illustrates a Lamb wave resonator 120" without an electrode on a side of the piezoelectric layer 115 that opposes the IDT 112.

Figure 12D:
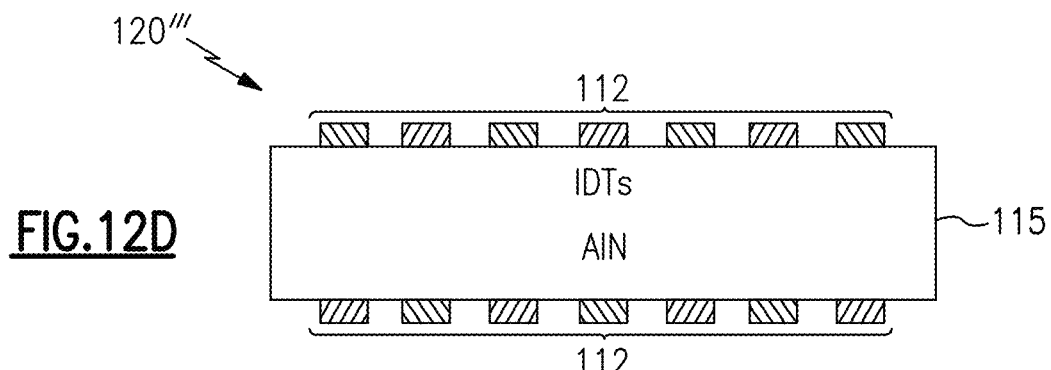

FIG. 12D illustrates a Lamb wave resonator 120''' that includes an IDT 117 on a second side of the piezoelectric layer 115 that is opposite to a first side on which the IDT 112 is disposed. The signal and ground electrodes are offset relative to each other for the IDTs 112 and 117.

Figure 12E:
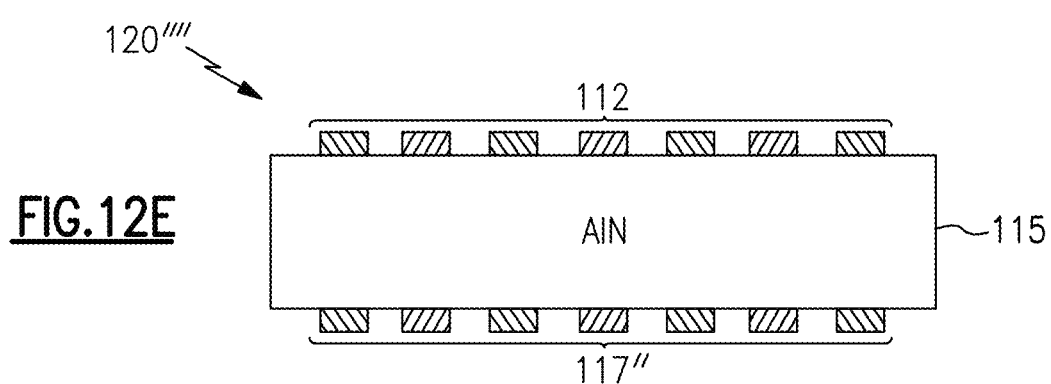

FIG. 12E illustrates a Lamb wave resonator 120'''' that includes an IDT 117' on a second side of the piezoelectric layer 115 that is opposite to a first side on which the IDT 112 is disposed. The signal and ground electrodes are aligned with each other for the IDTs 112 and 117'.

Figure 12F:
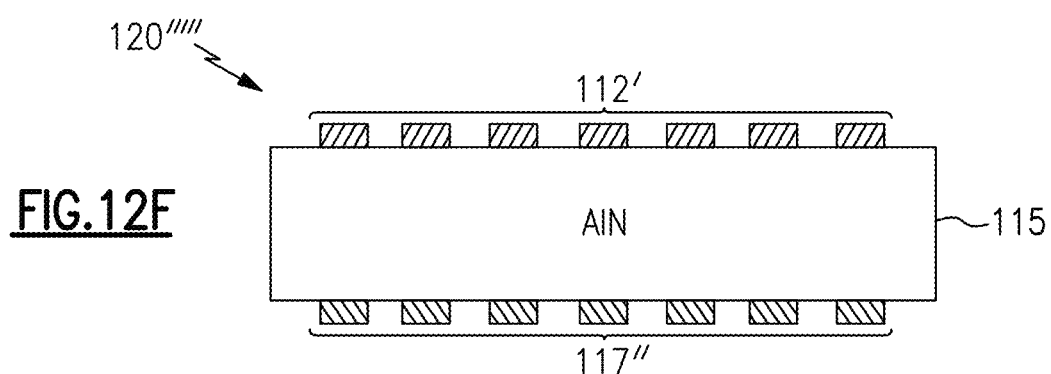

FIG. 12F illustrates a Lamb wave resonator 120''''' that includes an IDT 117" on a second side of the piezoelectric layer 115 that is opposite to a first side on which the IDT 112' is disposed. In the illustrated cross section, the IDT 112' includes only signal electrodes and the IDT 117" includes only ground electrodes.

As discussed above, aluminum nitride Lamb wave resonators can be compatible with CMOS process technology. Accordingly, CMOS circuitry and an aluminum nitride Lamb wave resonator can be implemented on a common semiconductor die.

Figure 13:
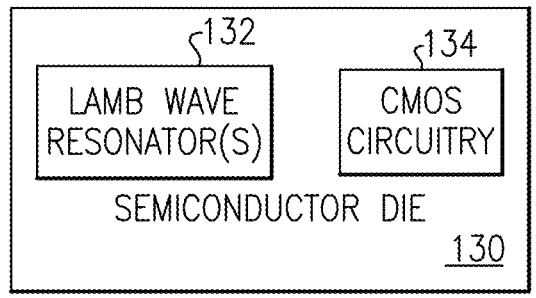
FIG. 13 is a schematic block diagram of a piston mode Lamb wave resonator and complementary metal oxide semiconductor (CMOS) circuitry on a semiconductor die.

FIG. 13 is a schematic block diagram of a semiconductor die 130 that includes a piston mode Lamb wave resonator 132 and CMOS circuitry 134. Advantageously, the Lamb wave resonator 132 can include an aluminum nitride piezoelectric layer that can be integrated with the CMOS circuitry 134 on a common semiconductor die 130.

The piston mode Lamb wave resonators disclosed herein can be implemented in a various applications. Example applications includes in an oscillator, a sensor, and a filter. These applications will be discussed with reference to FIGS. 14 to 16.

Figure 14:
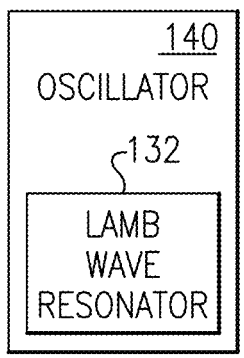
FIG. 14 is a schematic block diagram of an oscillator that includes a piston mode Lamb wave resonator.

FIG. 14 illustrates that an oscillator 140 can include a piston mode Lamb wave resonator 132. The oscillator 140 can be any oscillator that could benefit from a piston mode Lamb wave resonator. For example, the oscillator 140 can be included in a radio frequency front end. The oscillator 140 can be implemented in place of another oscillator, such as a quartz oscillator, in a variety of applications. The oscillator 140 can be provide a frequency reference. The oscillator 140 can generate a local oscillator for up converting and/or a down converting a signal.

Figure 15:
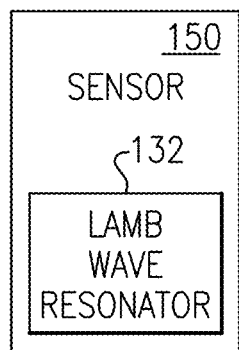
FIG. 15 is a schematic block diagram of a sensor that includes a piston mode Lamb wave resonator.

FIG. 15 illustrates that a sensor 150 can include a piston mode Lamb wave resonator 132. The sensor 150 can be any sensor that could benefit from a piston mode Lamb wave resonator. For example, the sensor 150 can be arranged to sense pressure, to sense temperature, or to sense any other suitable parameter. In some instances, the sensor 150 can be configured for in liquid sensing applications.

Figure 16:
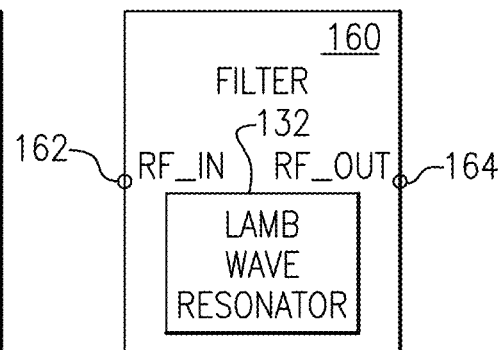
FIG. 16 is a schematic block diagram of a filter that includes a piston mode Lamb wave resonator.

FIG. 16 illustrates that a filter 160 can include a piston mode Lamb wave resonator 132. The filter 160 can receive a radio frequency signal at an input node 162 and provided a filtered radio frequency signal at an output node 164. The piston mode Lamb wave resonator 132 is coupled between the input node 162 and the output node 164 in the filter 160. The filter 160 is an acoustic wave filter. The filter 160 can include any suitable number of piston mode Lamb wave resonators.

The piston mode Lamb wave resonators disclosed herein can be implemented in a variety of packaged modules. An example packaged module will now be described in which any suitable principles and advantages of the piston mode Lamb wave resonators disclosed herein can be implemented. A packaged module can include one or more features of the packaged module of FIG. 17.

Figure 17:
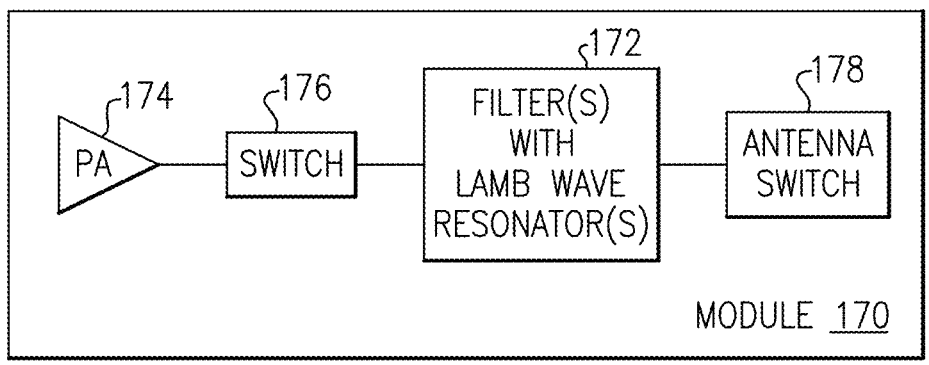
FIG. 17 is a schematic block diagram of a module that includes a filter with a piston mode Lamb wave resonator.

FIG. 17 is a schematic block diagram of a module 170 that includes a filter 172 with a piston mode Lamb wave resonator in accordance with any suitable principles and advantage disclosed herein. The module 170 includes a power amplifier 174, a switch 176, the filter 172 that includes a piston mode Lamb wave resonator, and an antenna switch 178. The power amplifier 174 can amplify a radio frequency signal. The switch 174 can selectively electrically couple an output of the power amplifier 176 to the filter 172. The filter 176 can be a band pass filter. The filter 176 can be included in a duplexer or other multiplexer. The output of the filter 172 is coupled to an antenna switch 178. The antenna switch 178 can be a multi-throw radio frequency switch. The antenna switch 178 can selectively electrically couple an output of the filter 172 to an antenna port of the module 170. The module 170 can include a package that encloses the illustrated elements. The filter 172 with the piston mode Lamb wave resonator can be disposed on a common packaging substrate with the other illustrated elements of the module 170. The packaging substrate can be a laminate substrate, for example.

Figure 18:
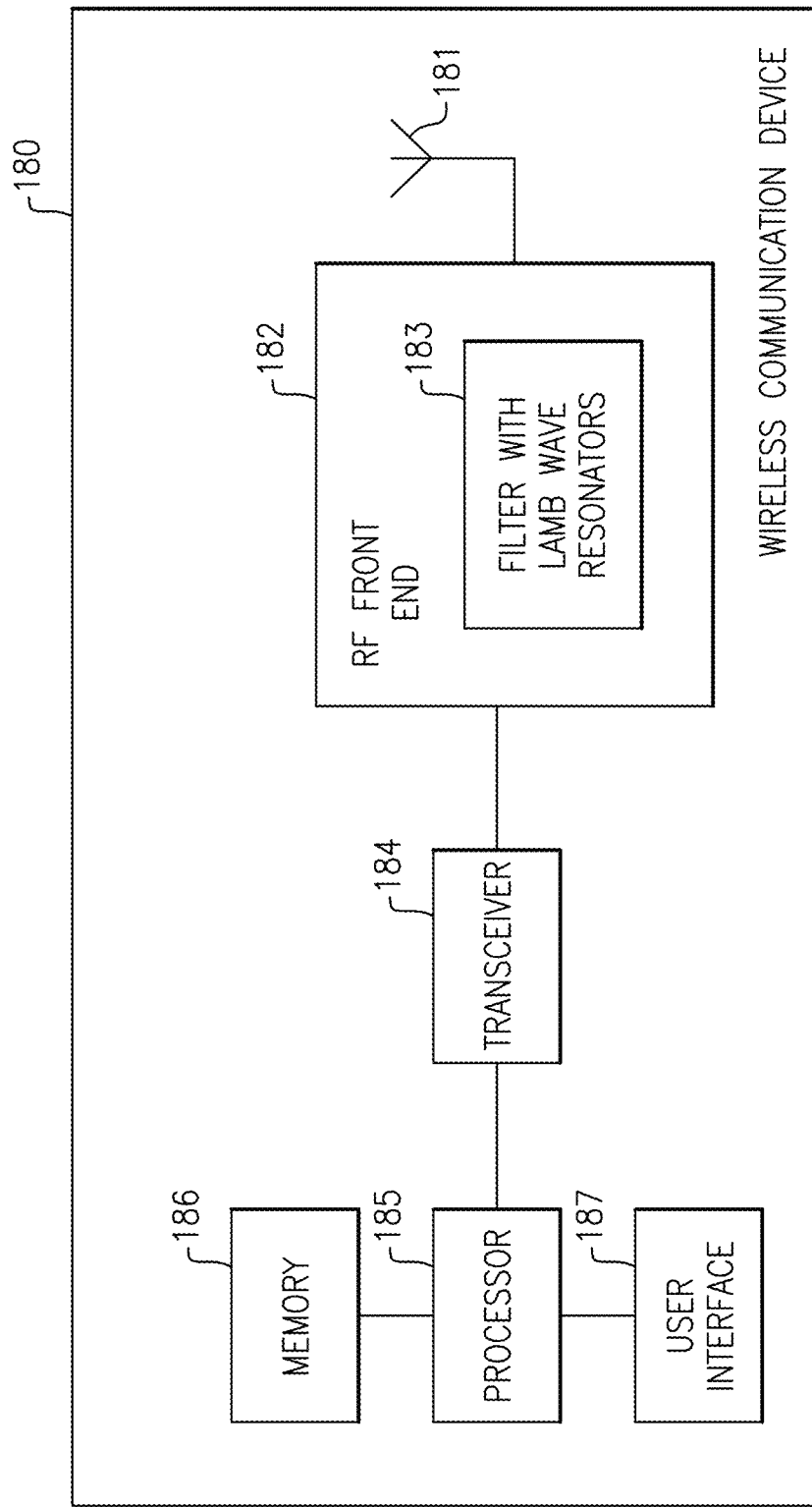
FIG. 18 is a schematic block diagram of a wireless communication device that includes a filter with a piston mode Lamb wave resonator.

FIG. 18 is a schematic block diagram of a wireless communication device 180 that includes a filter 183 with a piston mode Lamb wave resonator in accordance with one or more embodiments. The wireless communication device 180 can be any suitable wireless communication device. For instance, a wireless communication device 180 can be a mobile phone, such as a smart phone. As illustrated, the wireless communication device 180 includes an antenna 181, an RF front end 182, an RF transceiver 184, a processor 185, a memory 186, and a user interface 187. The antenna 181 can transmit RF signals provided by the RF front end 182. The antenna 181 can provide received RF signals to the RF front end 182 for processing.

The RF front end 182 can include one or more power amplifiers, one or more low noise amplifiers, RF switches, receive filters, transmit filters, duplex filters, filters of a multiplexer, filters of a diplexers or other frequency multiplexing circuit, or any suitable combination thereof. The RF front end 182 can transmit and receive RF signals associated with any suitable communication standards. Any of the piston mode Lamb wave resonators disclosed herein can be implemented in filter 183 of the RF front end 182.

The RF transceiver 184 can provide RF signals to the RF front end 182 for amplification and/or other processing. The RF transceiver 184 can also process an RF signal provided by a low noise amplifier of the RF front end 182. The RF transceiver 184 is in communication with the processor 185. The processor 185 can be a baseband processor. The processor 185 can provide any suitable base band processing functions for the wireless communication device 180. The memory 186 can be accessed by the processor 185. The memory 186 can store any suitable data for the wireless communication device 180. The processor 185 is also in communication with the user interface 187. The user interface 187 can be any suitable user interface, such as a display.

Any of the embodiments described above can be implemented in association with mobile devices such as cellular handsets. The principles and advantages of the embodiments can be used for any systems or apparatus, such as any uplink wireless communication device, that could benefit from any of the embodiments described herein. The teachings herein are applicable to a variety of systems. Although this disclosure includes some example embodiments, the teachings described herein can be applied to a variety of structures. Any of the principles and advantages discussed herein can be implemented in association with RF circuits configured to process signals in a frequency range from about 30 kHz to 300 GHz, such as in a frequency range from about 450 MHz to 8.5 GHz.

Aspects of this disclosure can be implemented in various electronic devices. Examples of the electronic devices can include, but are not limited to, consumer electronic products, parts of the consumer electronic products such as packaged radio frequency modules, uplink wireless communication devices, wireless communication infrastructure, electronic test equipment, etc. Examples of the electronic devices can include, but are not limited to, a mobile phone such as a smart phone, a wearable computing device such as a smart watch or an ear piece, a telephone, a television, a computer monitor, a computer, a modem, a hand-held computer, a laptop computer, a tablet computer, a microwave, a refrigerator, a vehicular electronics system such as an automotive electronics system, a stereo system, a digital music player, a radio, a camera such as a digital camera, a portable memory chip, a washer, a dryer, a washer/dryer, a copier, a facsimile machine, a scanner, a multi-functional peripheral device, a wrist watch, a clock, etc. Further, the electronic devices can include unfinished products.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments or that one or more embodiments necessarily include logic for deciding, with or without author input or prompting, whether these features, elements and/or states are included or are to be performed in any particular embodiment.

While certain embodiments have been described, these embodiments have been presented by way of example only, and are not intended to limit the scope of the disclosure. Indeed, the novel apparatus, methods, and systems described herein may be embodied in a variety of other forms; furthermore, various omissions, substitutions and changes in the form of the methods and systems described herein may be made without departing from the spirit of the disclosure. For example, while blocks are presented in a given arrangement, alternative embodiments may perform similar functionalities with different components and/or circuit topologies, and some blocks may be deleted, moved, added, subdivided, combined, and/or modified. Each of these blocks may be implemented in a variety of different ways. Any suitable combination of the elements and acts of the various embodiments described above can be combined to provide further embodiments. The accompanying claims and their equivalents are intended to cover such forms or modifications as would fall within the scope and spirit of the disclosure.

What is claimed is:

1. A piston mode Lamb wave resonator with transverse mode suppression, the piston mode Lamb wave resonator comprising:
    a piezoelectric layer;
    an interdigital transducer electrode in contact with the piezoelectric layer; and
    an electrode in contact with the piezoelectric layer and positioned on an opposite side of the piezoelectric layer than the interdigital transducer electrode, the piston mode Lamb wave resonator having an active region and a border region, the border region configured to suppress a transverse mode, and the piston mode Lamb wave resonator configured to generate a Lamb wave in the piezoelectric layer.

2. The piston mode Lamb wave resonator of claim 1 wherein the piezoelectric layer is an aluminum nitride layer.

3. The piston mode Lamb wave resonator of claim 1 wherein the interdigital transducer electrode includes a bus bar and a plurality of fingers extending from the bus bar, each of the fingers having an end portion opposite the bus bar.

4. The piston mode Lamb wave resonator of claim 3 wherein the end portions of the fingers include metal that is wider than other portions of the respective fingers.

5. The piston mode Lamb wave resonator of claim 3 further comprising an oxide over the end portions of the fingers.

6. The piston mode Lamb wave resonator of claim 3 further comprising silicon nitride over a portion of the interdigital transducer electrode, the end portions being free from the silicon nitride.

7. The piston mode Lamb wave resonator of claim 3 wherein the interdigital transducer electrode includes a second bus bar having a lower metal coverage ratio adjacent the end portions than in other portions of the second bus bar.

8. The piston mode Lamb wave resonator of claim 1 wherein the border region has a larger metal coverage ratio than the active region.

9. The piston mode Lamb wave resonator of claim 1 wherein the border region has a larger metal coverage ratio than an inactive region of the piston mode Lamb wave resonator.

10. The piston mode Lamb wave resonator of claim 1 further comprising reflective gratings on opposing sides of the interdigital transducer electrode.

11. The piston mode Lamb wave resonator of claim 1 wherein the piston mode Lamb wave resonator has free edges.

12. The piston mode Lamb wave resonator of claim 1 further comprising an air cavity, the electrode positioned between at least a portion of the air cavity and the piezoelectric layer.

13. The piston mode Lamb wave resonator of claim 1 further comprising an acoustic mirror, the electrode positioned between at least a portion of the acoustic mirror and the piezoelectric layer.

14. An acoustic wave filter with a piston mode Lamb wave resonator, the acoustic wave filter comprising:
    an input node configured to receive a radio frequency signal;
    an output node; and
    a piston mode Lamb wave resonator coupled between the input node and the output node, the piston mode Lamb wave resonator including a piezoelectric layer, an interdigital transducer electrode on the piezoelectric layer, and an air cavity on an opposite side of the piezoelectric layer than the interdigital transducer electrode, the piston mode Lamb wave resonator being configured to generate a Lamb wave in the piezoelectric layer, the piston mode Lamb wave resonator having an active region and a border region, the border region configured to suppress a transverse mode, and the acoustic wave filter being configured to filter the radio frequency signal.

15. The acoustic wave filter of claim 14 wherein the border region has a larger metal coverage ratio than the active region.

16. The acoustic wave filter of claim 14 wherein the interdigital transducer electrode includes a bus bar and fingers extending from the bus bar, a finger of the fingers including an end portion opposite the bus bar that has metal that is wider than other portions of the finger.

17. The acoustic wave filter of claim 14 wherein the Lamb wave resonator includes reflective gratings on opposing sides of the interdigital transducer electrode.

18. The acoustic wave filter of claim 14 wherein the piezoelectric layer includes an aluminum nitride layer.

19. A method of filtering a radio frequency signal using a piston mode Lamb wave resonator, the method comprising:
    providing the radio frequency signal to a filter that includes the piston mode Lamb wave resonator, the Lamb wave resonator including an aluminum nitride piezoelectric substrate, an interdigital transducer electrode in contact with a first side of the aluminum nitride piezoelectric substrate, and an electrode in contact with a second side of the aluminum nitride piezoelectric substrate, the second side opposing the first side; and
    filtering the radio frequency signal with the filter, the filtering including generating a Lamb wave in the aluminum nitride piezoelectric substrate and suppressing a transverse mode using a border region of the piston mode Lamb wave resonator.

20. The piston mode Lamb wave resonator of claim 19 wherein the piston mode Lamb wave resonator is arranged so as to have even order modes that have a multiple of full wave lengths in the active region.

\* \* \* \* \*